United States Patent
Wang

(10) Patent No.: US 12,131,901 B2
(45) Date of Patent: Oct. 29, 2024

(54) SEMICONDUCTOR STRUCTURE WITH PATTERNED FIN STRUCTURE

(71) Applicant: TAIWAN SEMICONDUCTOR MANUFACTURING CO., LTD., Hsinchu (TW)

(72) Inventor: Shiang-Bau Wang, Taoyuan (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 219 days.

(21) Appl. No.: 16/921,232

(22) Filed: Jul. 6, 2020

(65) Prior Publication Data

US 2020/0335323 A1  Oct. 22, 2020

Related U.S. Application Data

(60) Continuation of application No. 16/231,728, filed on Dec. 24, 2018, now Pat. No. 10,707,072, which is a continuation of application No. 15/599,225, filed on May 18, 2017, now Pat. No. 10,163,624, which is a
(Continued)

(51) Int. Cl.
| | |
|---|---|
| *H01L 21/02* | (2006.01) |
| *H01L 29/165* | (2006.01) |
| *H01L 29/267* | (2006.01) |
| *H01L 29/51* | (2006.01) |
| *H01L 29/66* | (2006.01) |
| *H01L 29/78* | (2006.01) |

(52) U.S. Cl.
CPC .... *H01L 21/0223* (2013.01); *H01L 29/66795* (2013.01); *H01L 29/165* (2013.01); *H01L 29/267* (2013.01); *H01L 29/517* (2013.01); *H01L 29/66545* (2013.01); *H01L 29/7848* (2013.01)

(58) Field of Classification Search
CPC ......... H01L 21/823431; H01L 27/0886; H01L 21/823481; H01L 29/7853–7854; H01L 2924/13067; H01L 2029/7857–7858; H01L 29/41791; H01L 29/66795–66818; H01L 29/785–7856; H01L 29/04–045; H01L 29/02–365; H01L 29/16–1608; H01L 29/18–185; H01L 29/36–365; H01L 29/22–2206; H01L 27/0924; H01L 27/1211; H01L 21/823821; H01L 21/845; H10B 12/36; H10B 12/056
See application file for complete search history.

(56) References Cited

U.S. PATENT DOCUMENTS

| | | |
|---|---|---|
| 9,159,734 B2 | 10/2015 | Hafez et al. |
| 9,728,646 B2 | 8/2017 | Wu et al. |
| 2011/0097889 A1 | 4/2011 | Yuan et al. |

(Continued)

*Primary Examiner* — Julio J Maldonado
*Assistant Examiner* — Stanetta D Isaac
(74) *Attorney, Agent, or Firm* — Slater Matsil, LLP

(57) ABSTRACT

Semiconductor structures are provided. The semiconductor structure includes a substrate and a first fin structure and a second fin structure formed over the substrate. In addition, the second fin structure is higher than the first fin structure. The semiconductor structure further includes an isolation structure formed around the second fin structure and covering a top surface of the first fin structure and a gate structure formed over the first fin structure and the second fin structure. In addition, the top surface of the first fin structure is not flat.

20 Claims, 32 Drawing Sheets

Related U.S. Application Data division of application No. 14/577,547, filed on Dec. 19, 2014, now Pat. No. 9,659,766.

(56) References Cited

U.S. PATENT DOCUMENTS

| | | | |
|---|---|---|---|
| 2013/0277720 A1* | 10/2013 | Kim | H01L 29/785 257/288 |
| 2013/0277759 A1* | 10/2013 | Chen | H01L 27/0886 257/E21.546 |
| 2013/0320453 A1* | 12/2013 | Pethe | H01L 29/66795 257/E21.409 |
| 2014/0131813 A1* | 5/2014 | Liaw | H01L 29/0657 438/689 |
| 2014/0159165 A1* | 6/2014 | van Dal | H01L 29/66795 438/283 |
| 2014/0239404 A1 | 8/2014 | Huang et al. | |
| 2014/0242775 A1 | 8/2014 | Lin et al. | |
| 2015/0214119 A1 | 7/2015 | Basker | |
| 2017/0069504 A1* | 3/2017 | Li | H01L 29/0657 |

* cited by examiner

SEMICONDUCTOR STRUCTURE WITH PATTERNED FIN STRUCTURE

CROSS REFERENCE TO RELATED APPLICATIONS

This application is a Continuation application of U.S. patent application Ser. No. 16/231,728, filed on Dec. 24, 2018, which is a Continuation application of U.S. patent application Ser. No. 15/599,225, filed on May 18, 2017, which is a Divisional application of U.S. patent application Ser. No. 14/577,547, filed on Dec. 19, 2014, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figures 1, 1A:
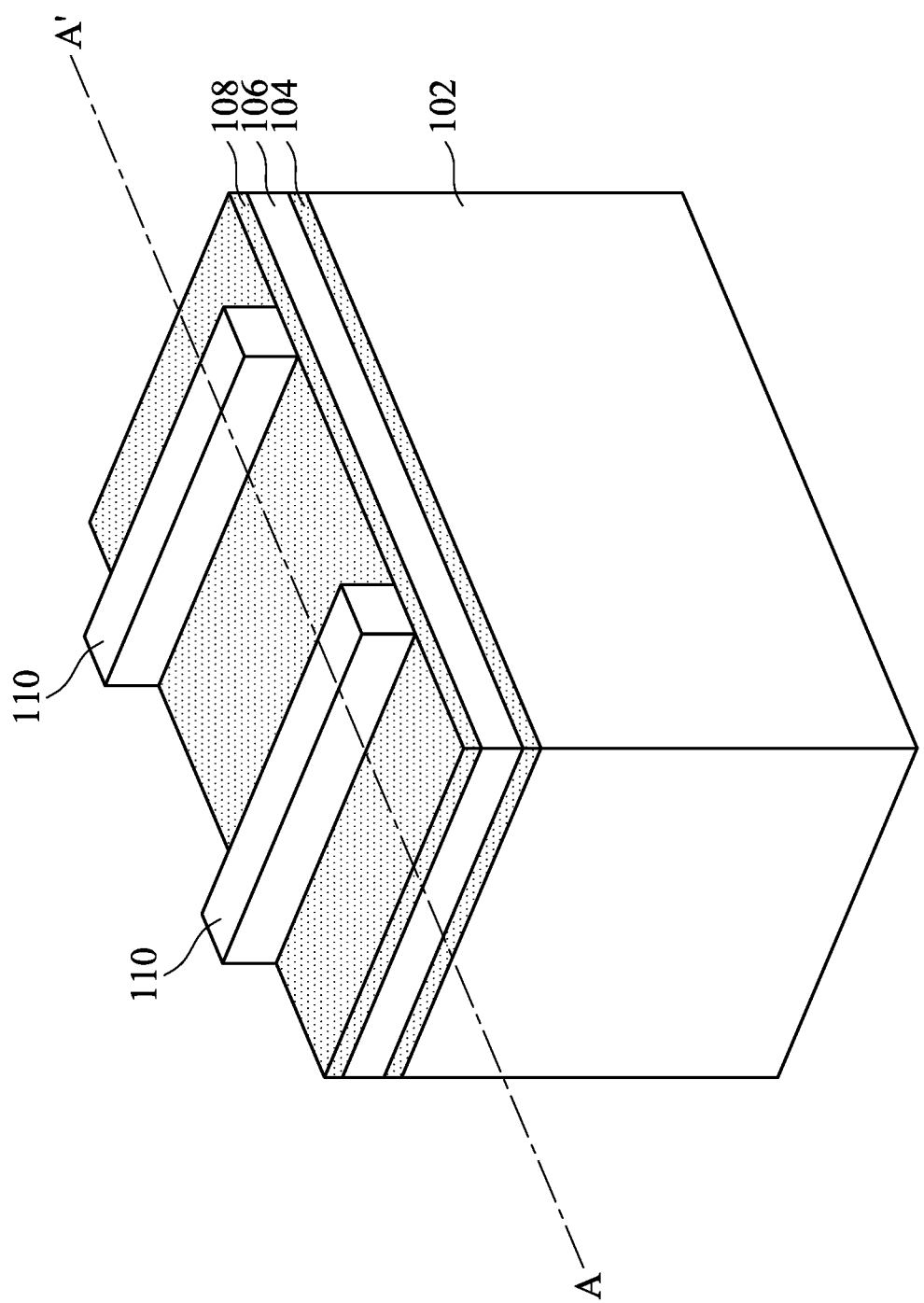
FIGS. 1A-1 to 1N-2 are perspective and cross-sectional representations of various stages of forming a semiconductor structure 100a in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided in accordance with some embodiments of the disclosure. The method for forming the semiconductor structure includes forming a number of fin structures and removing at least one of the fin structures. The fin structure may be removed by an etching process. However, after the etching process, some portion of the fin structure may not be completely removed, and the remaining portion of the fin structure may lead to circuit short. Therefore, in some embodiments, the remaining portion of the fin structure is oxidized to prevent the short circuit.

Figures 1, 1B:
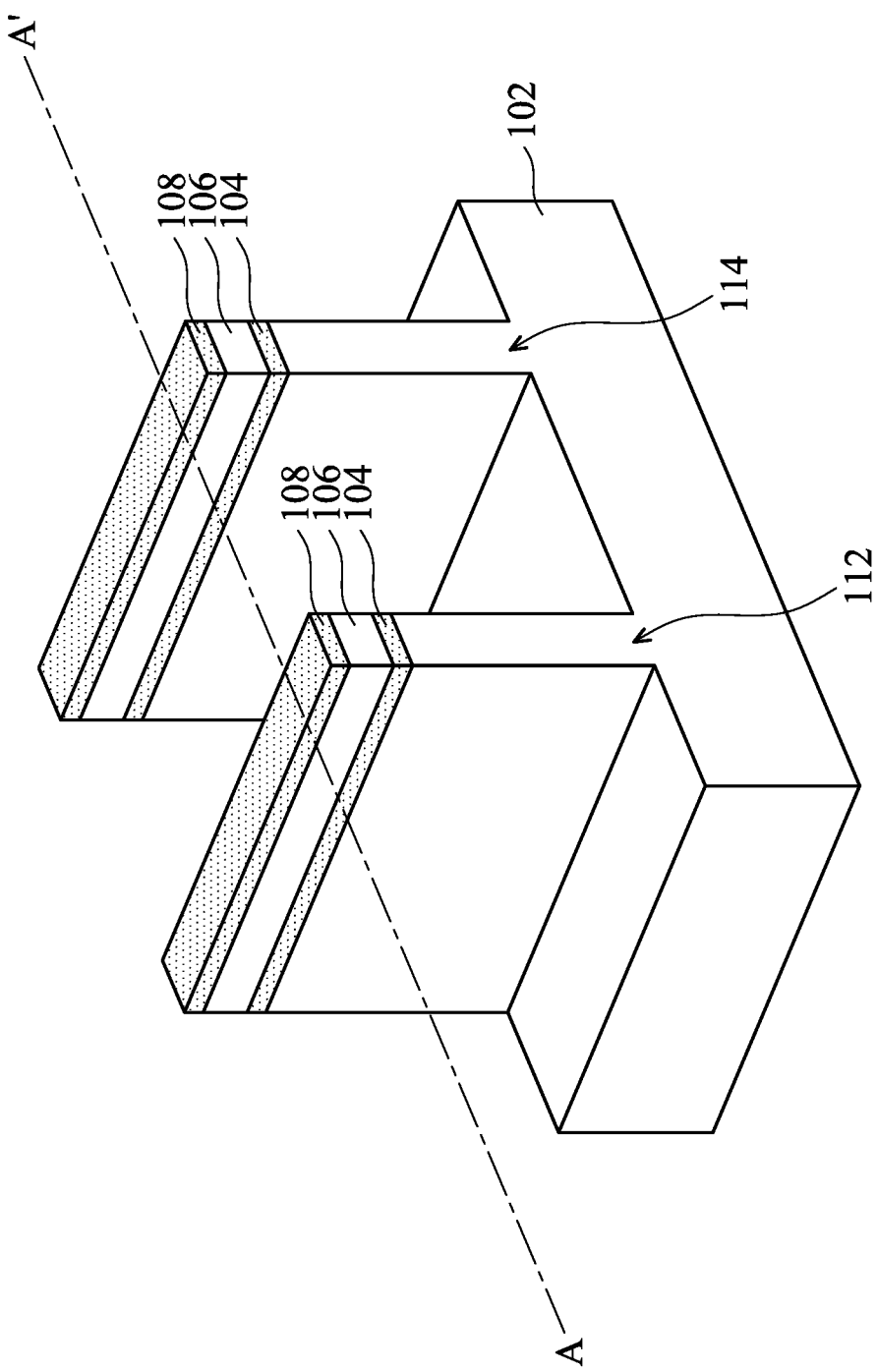
Figures 1, 1C:
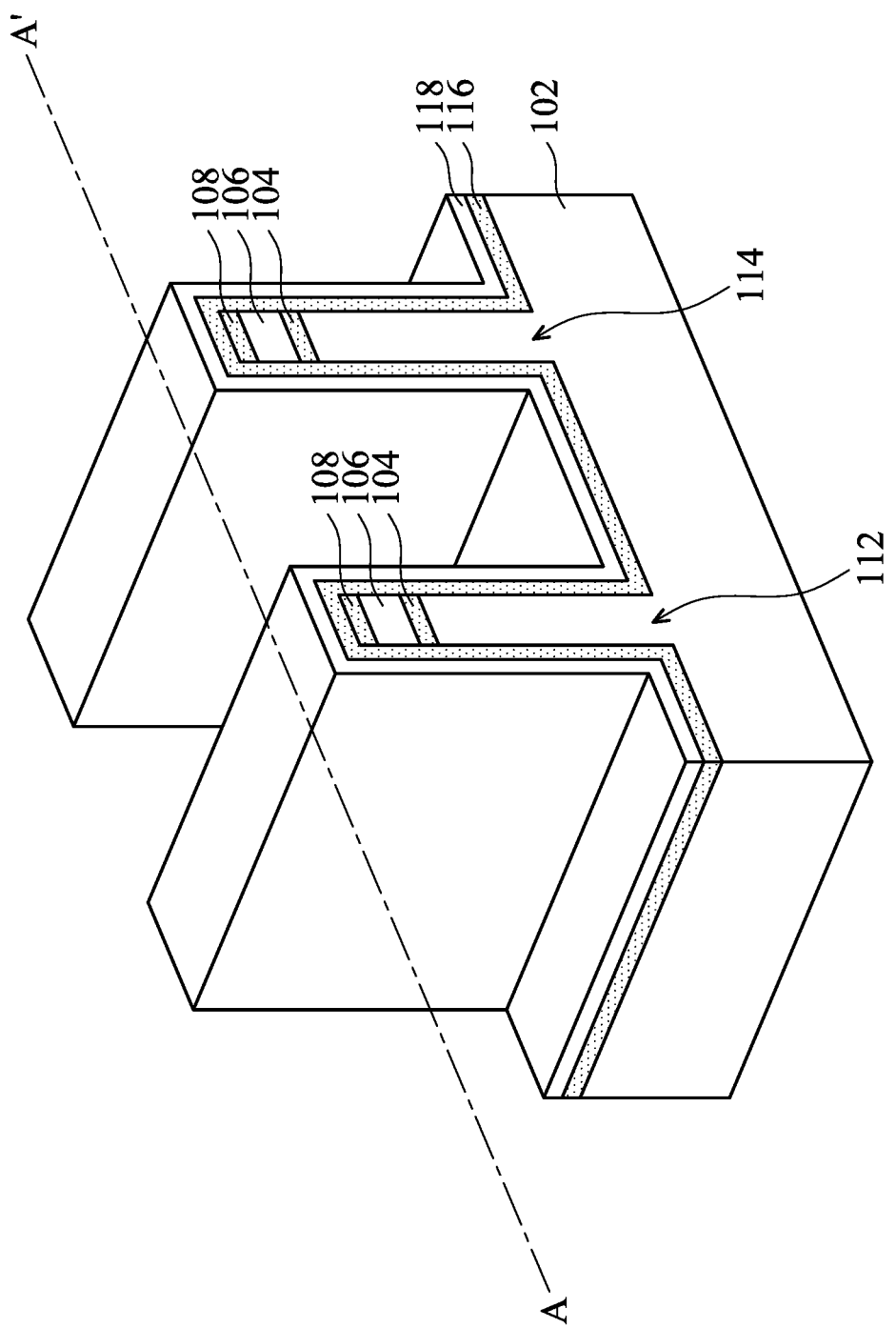
Figures 1, 1D:
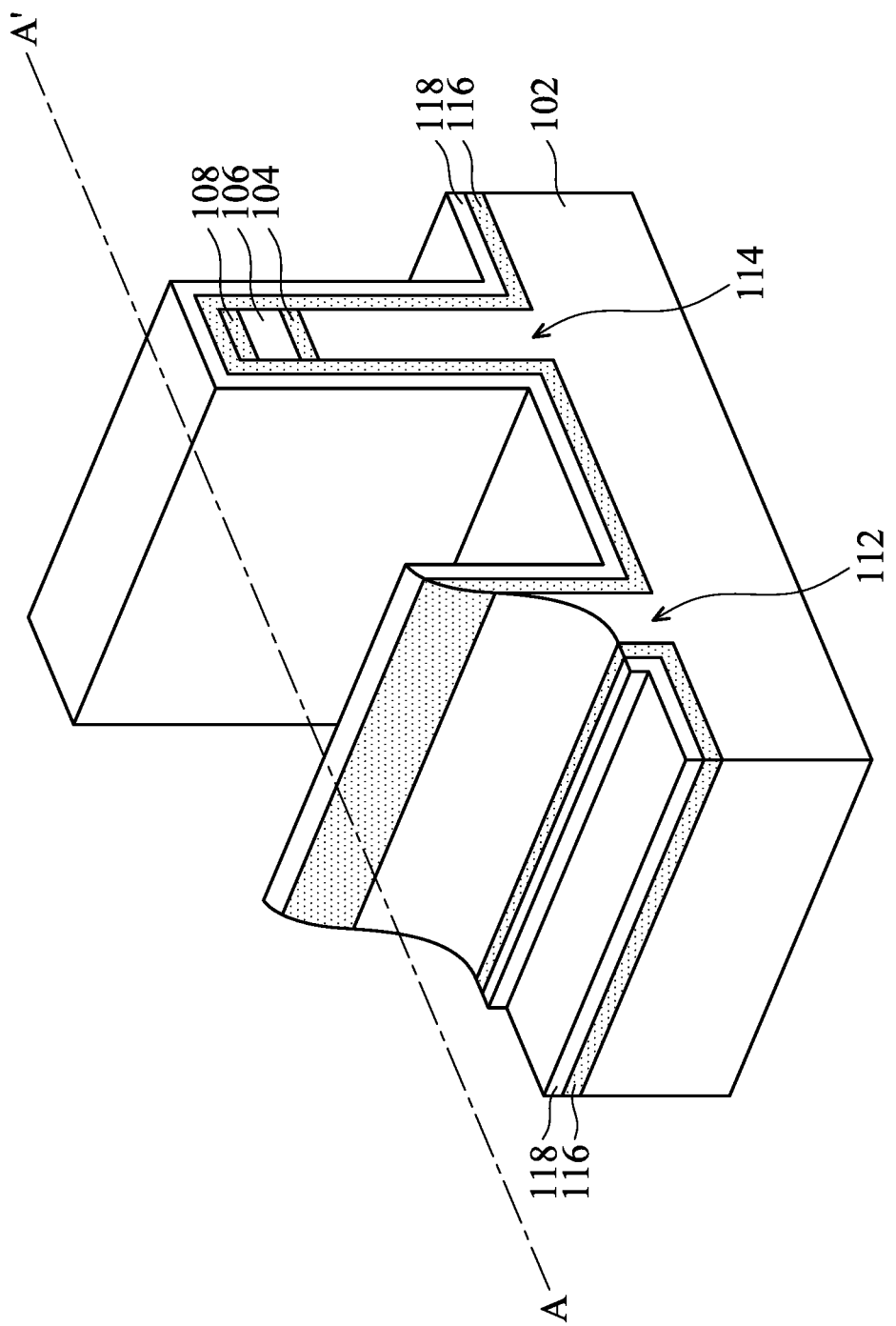
Figures 1, 1E:
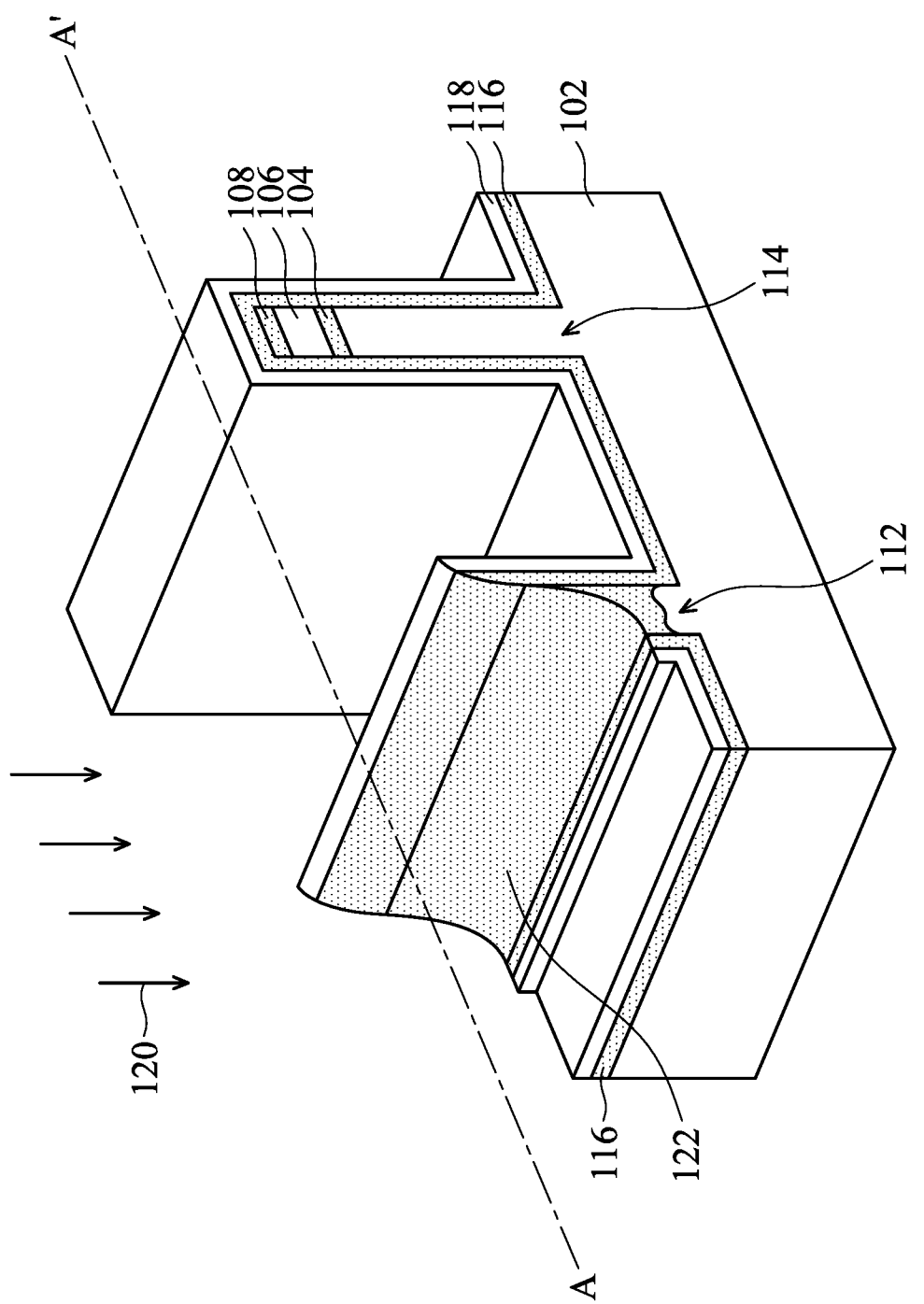
Figures 1, 1F:
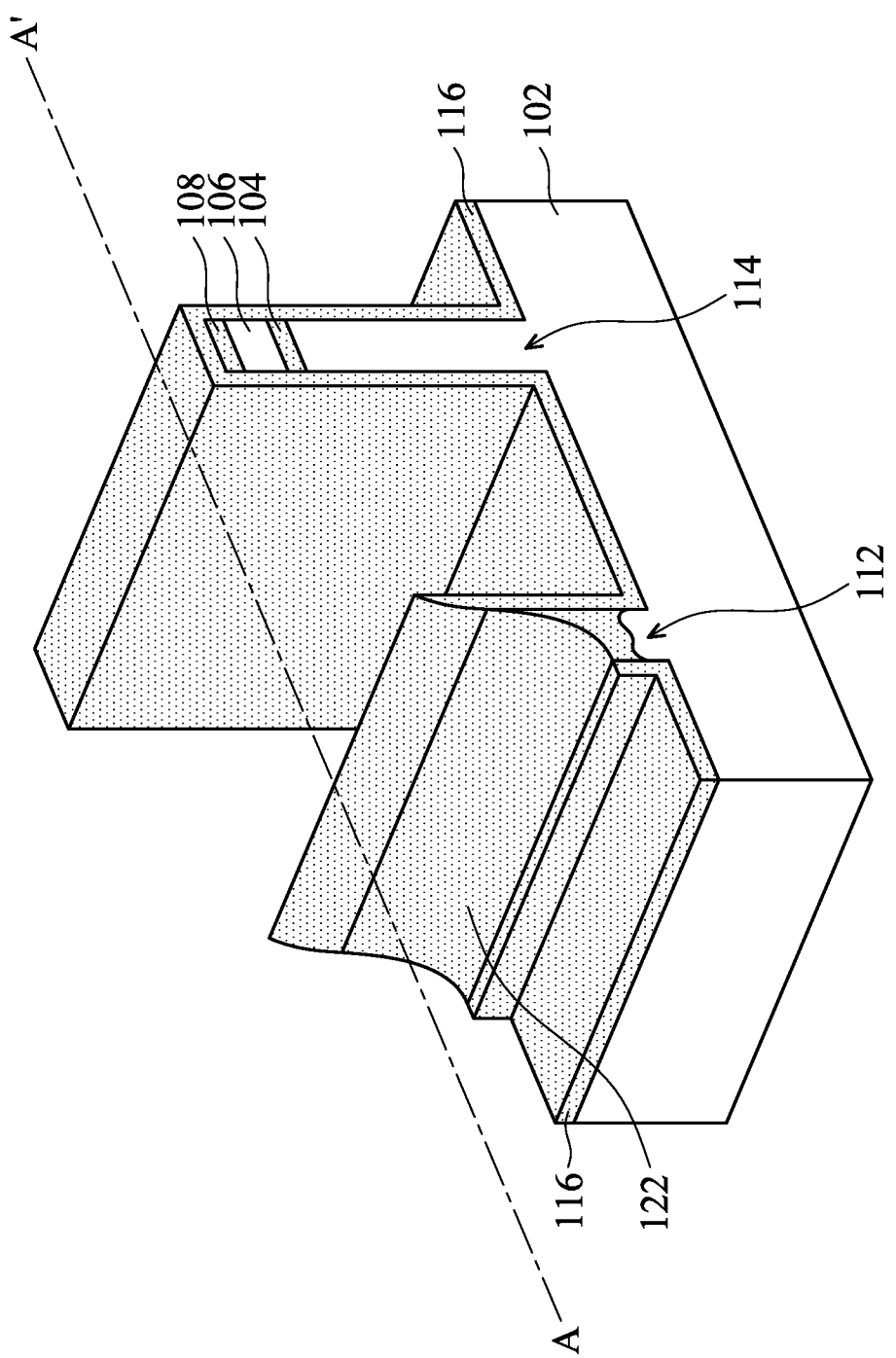
Figures 1, 1G:
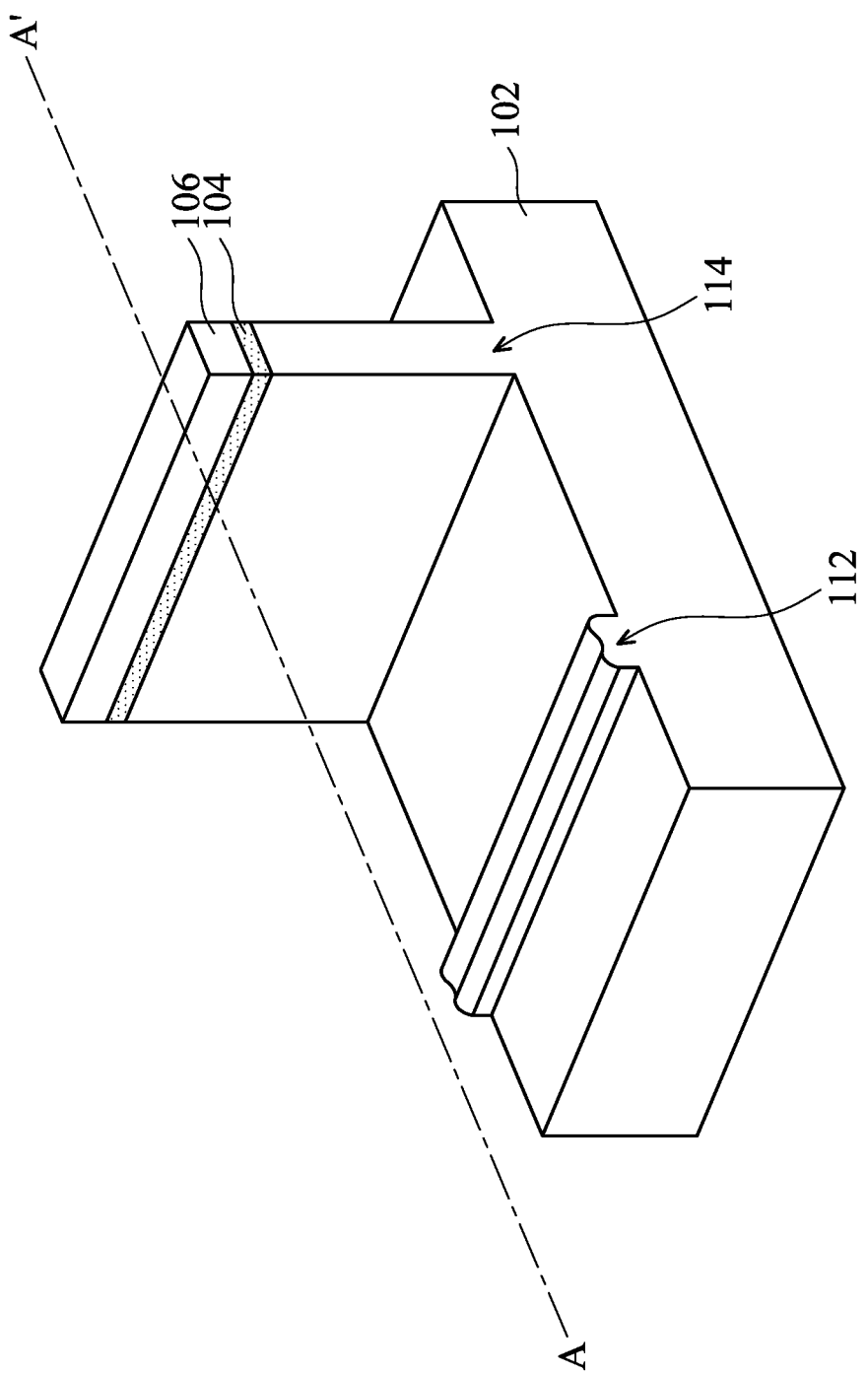
Figures 1, 1H:
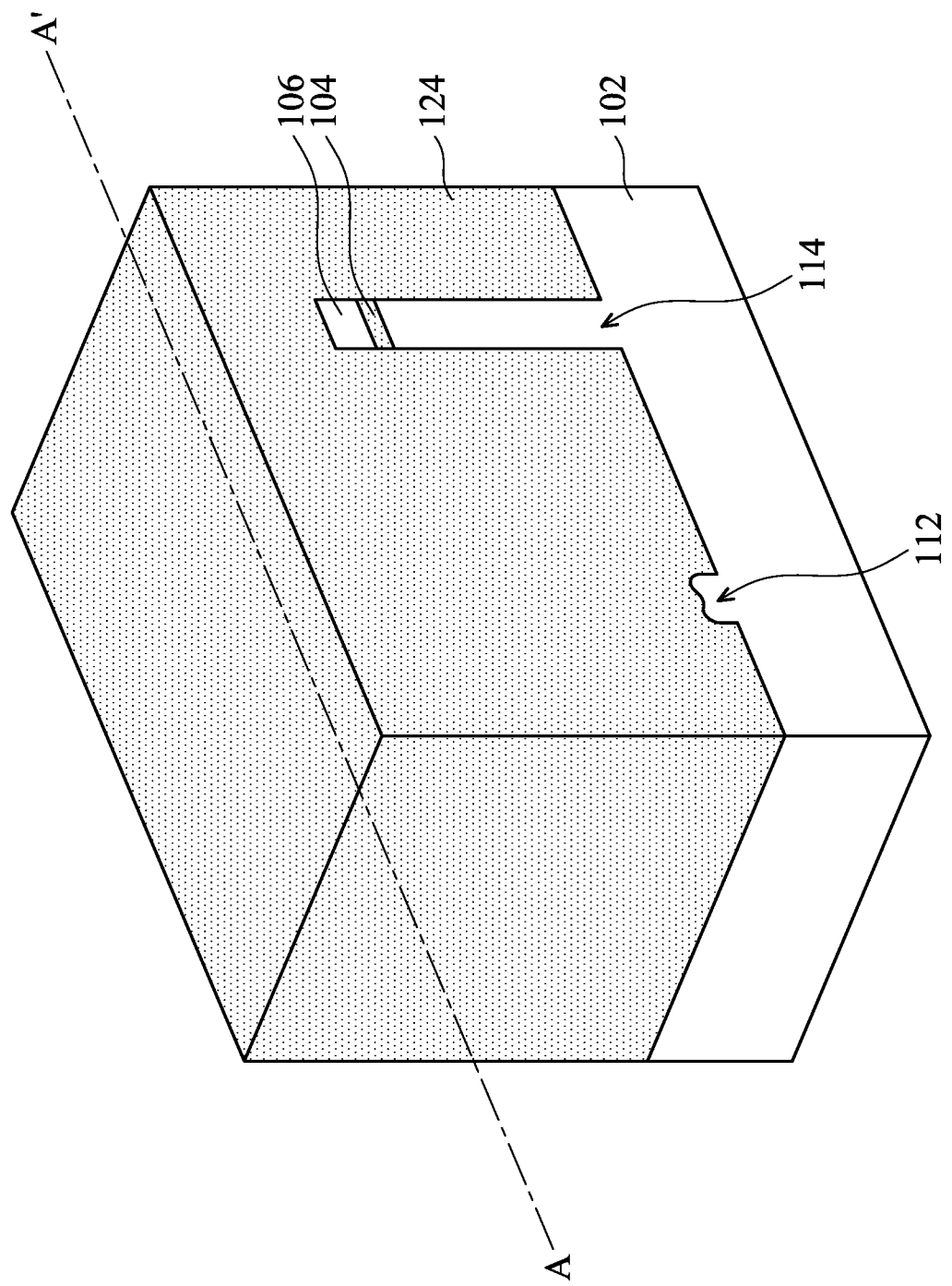
Figures 1, 1I:
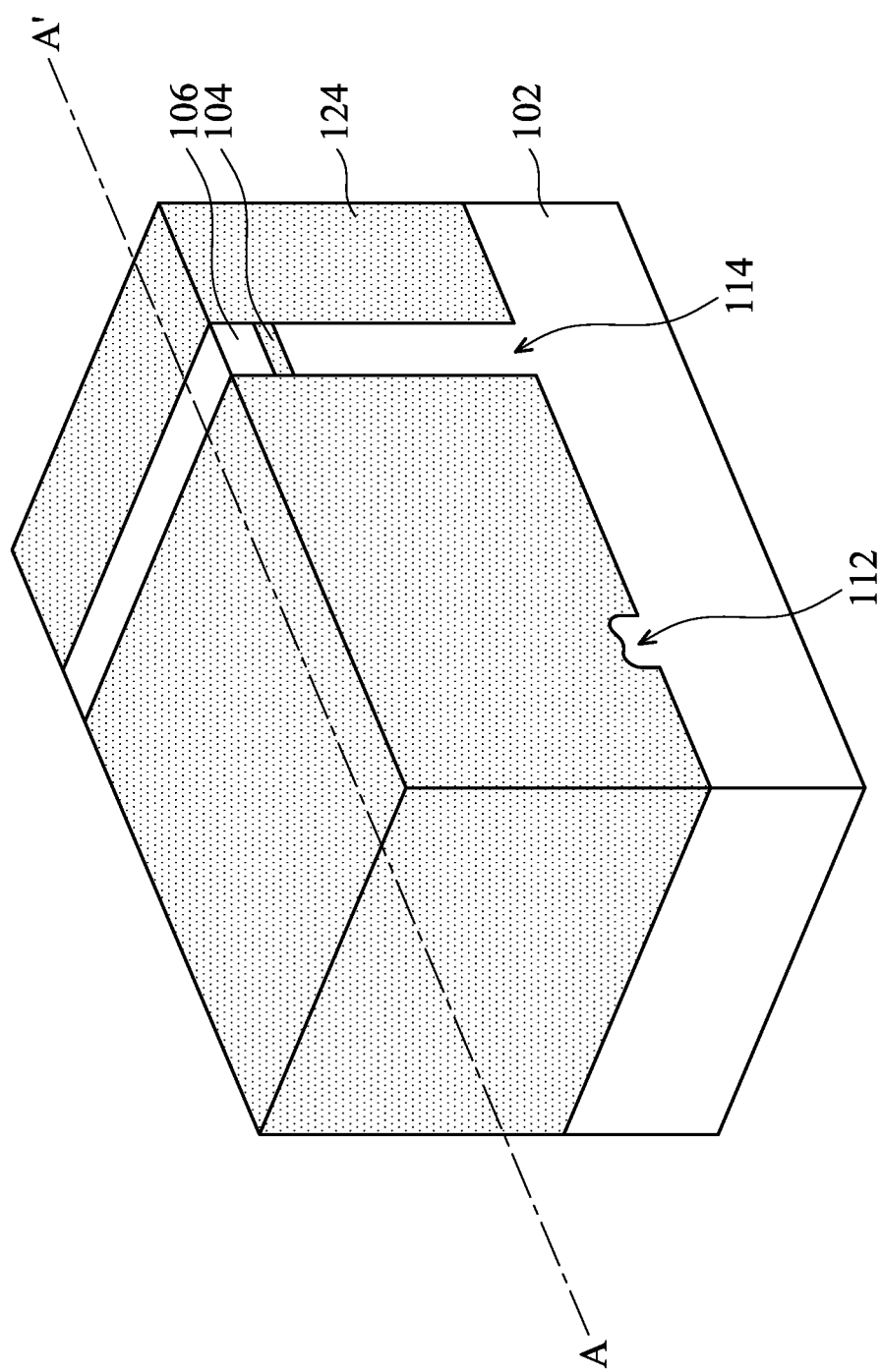
Figures 1, 1J:
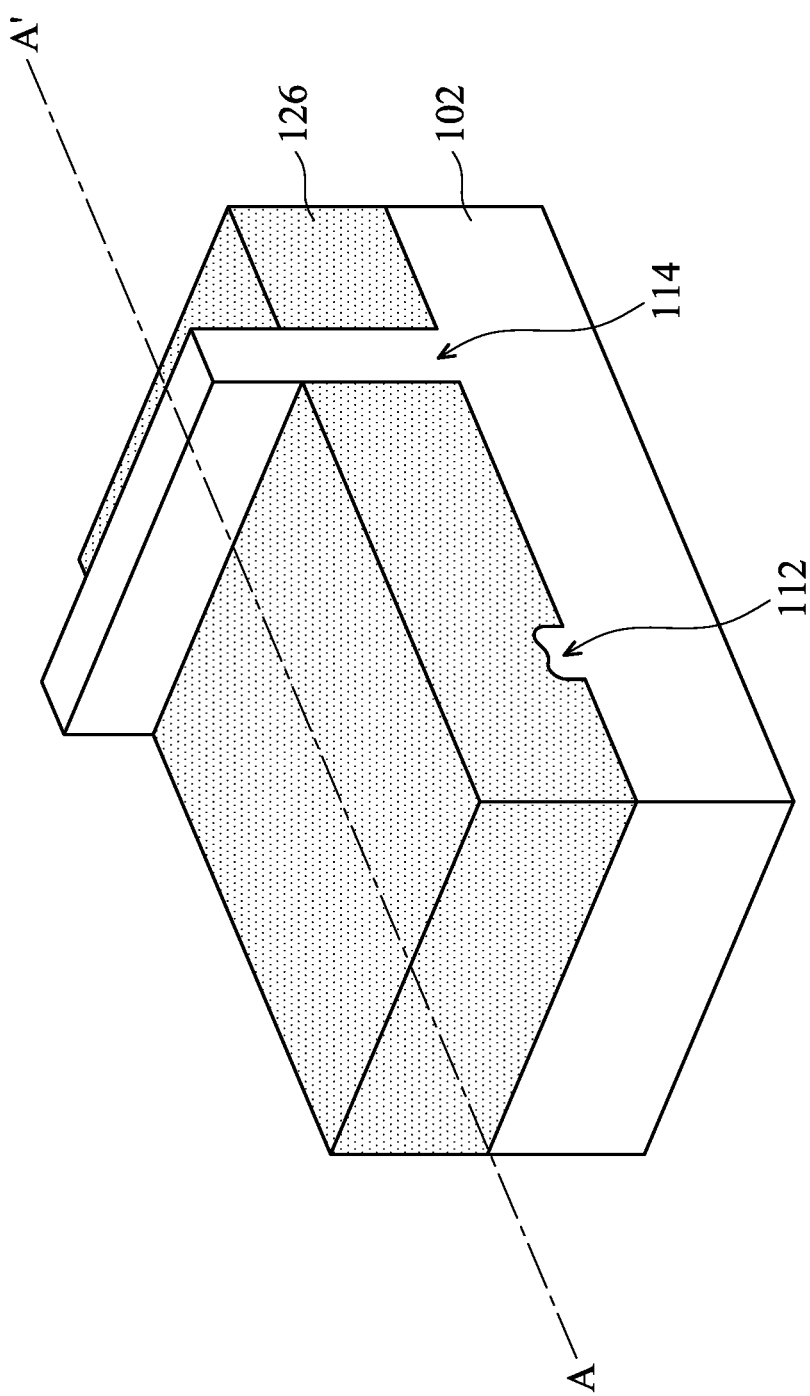
Figures 1, 1K:
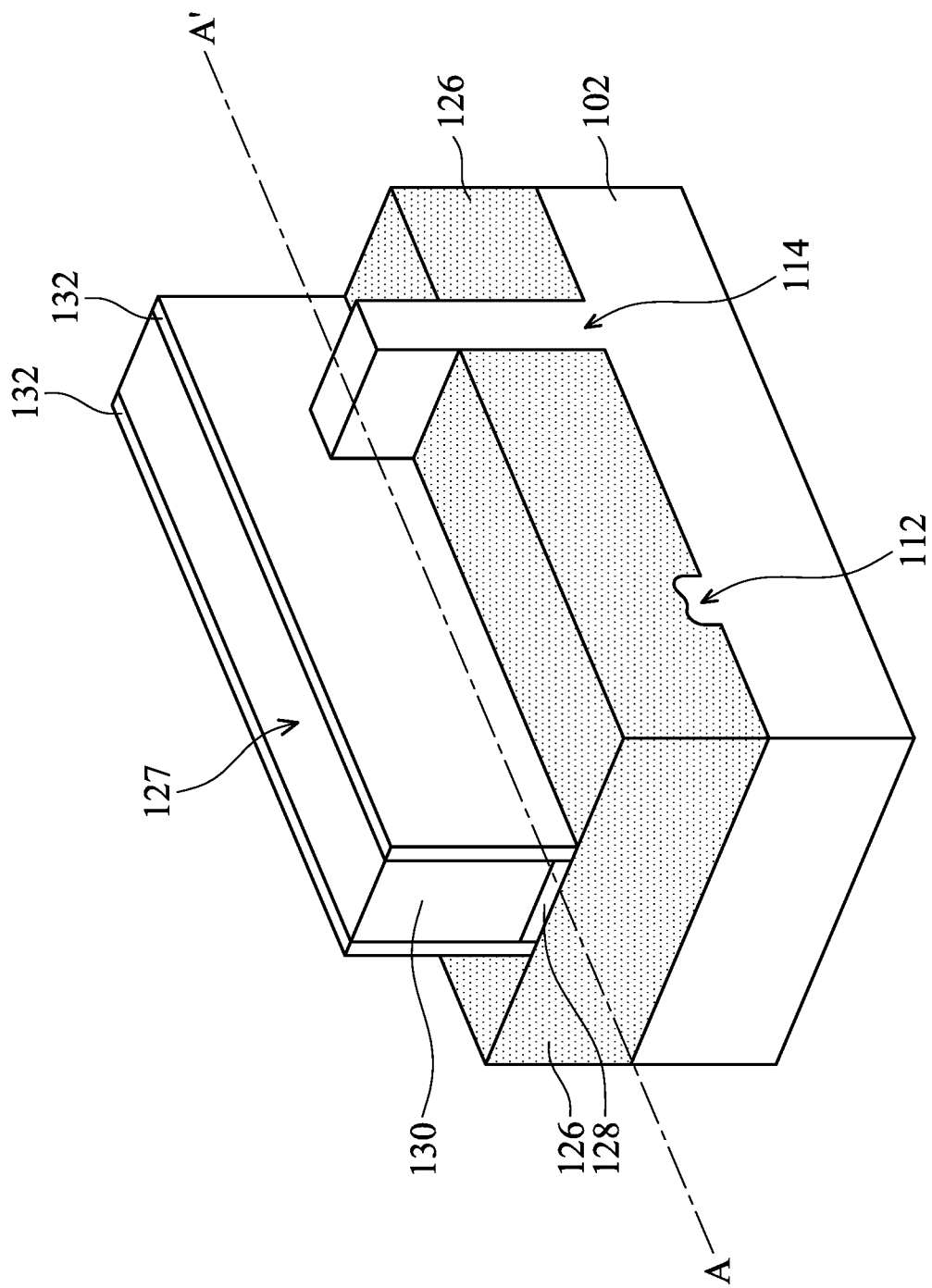
Figures 1, 1L:
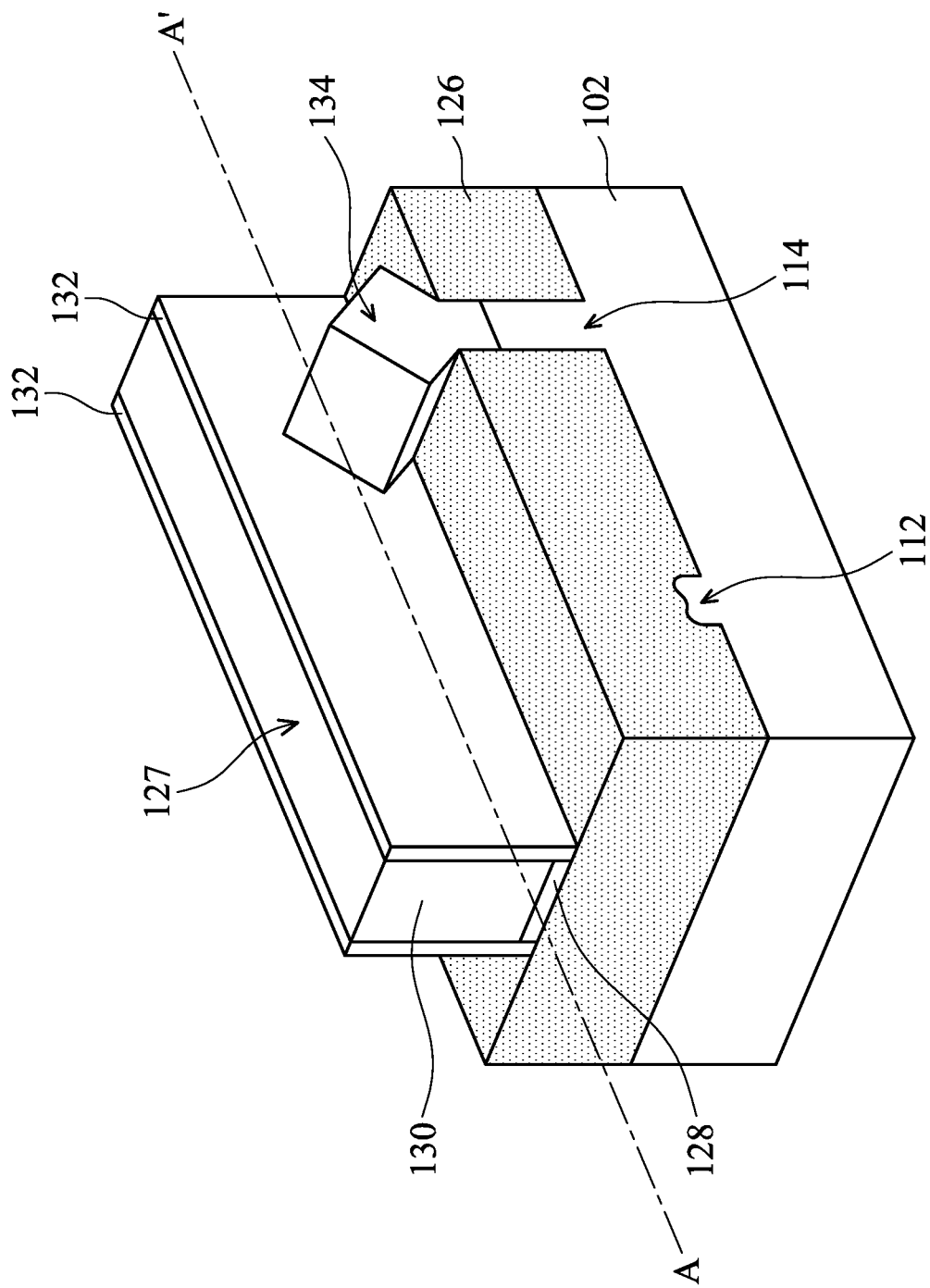
Figures 1, 1M:
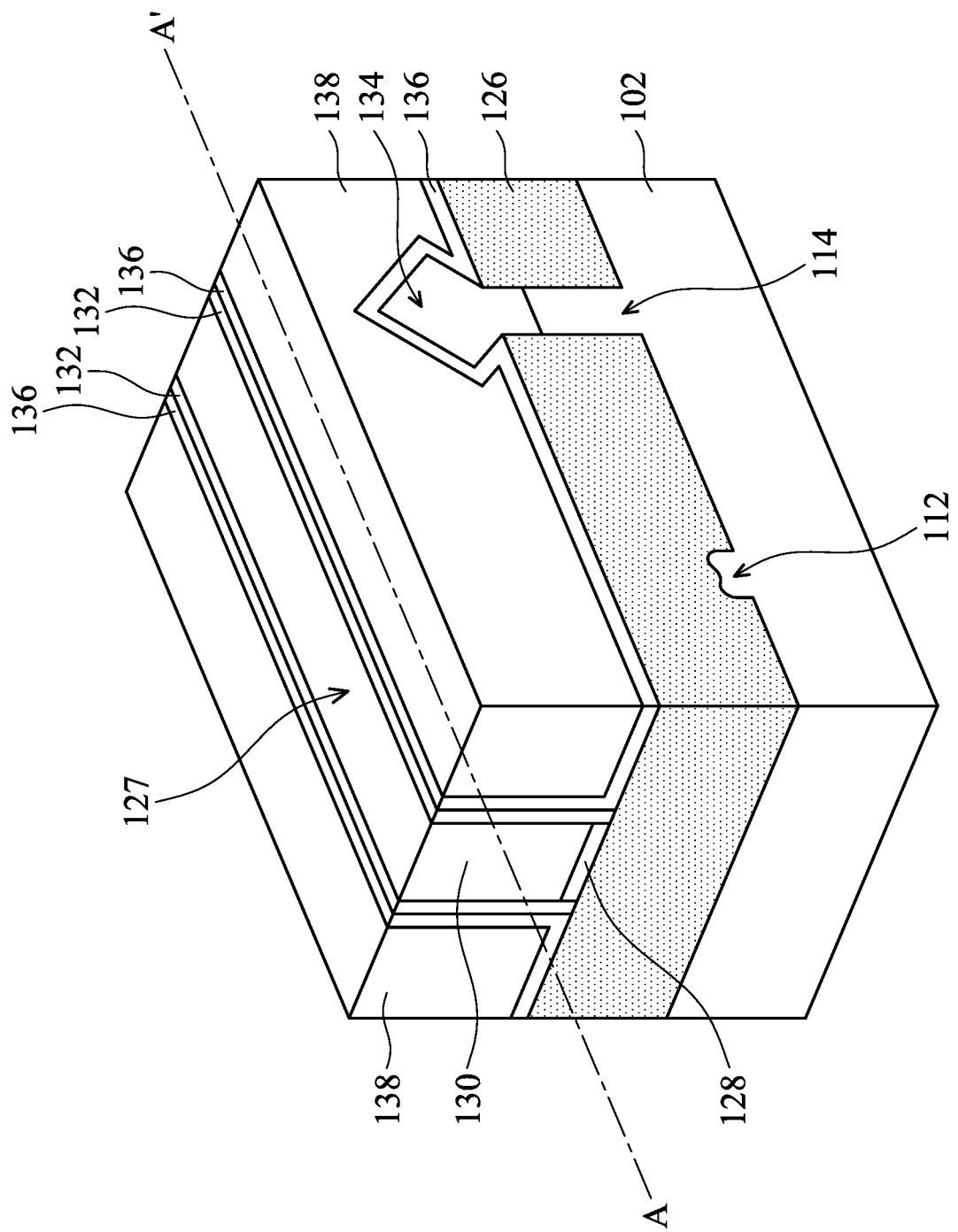
Figures 1, 1N:
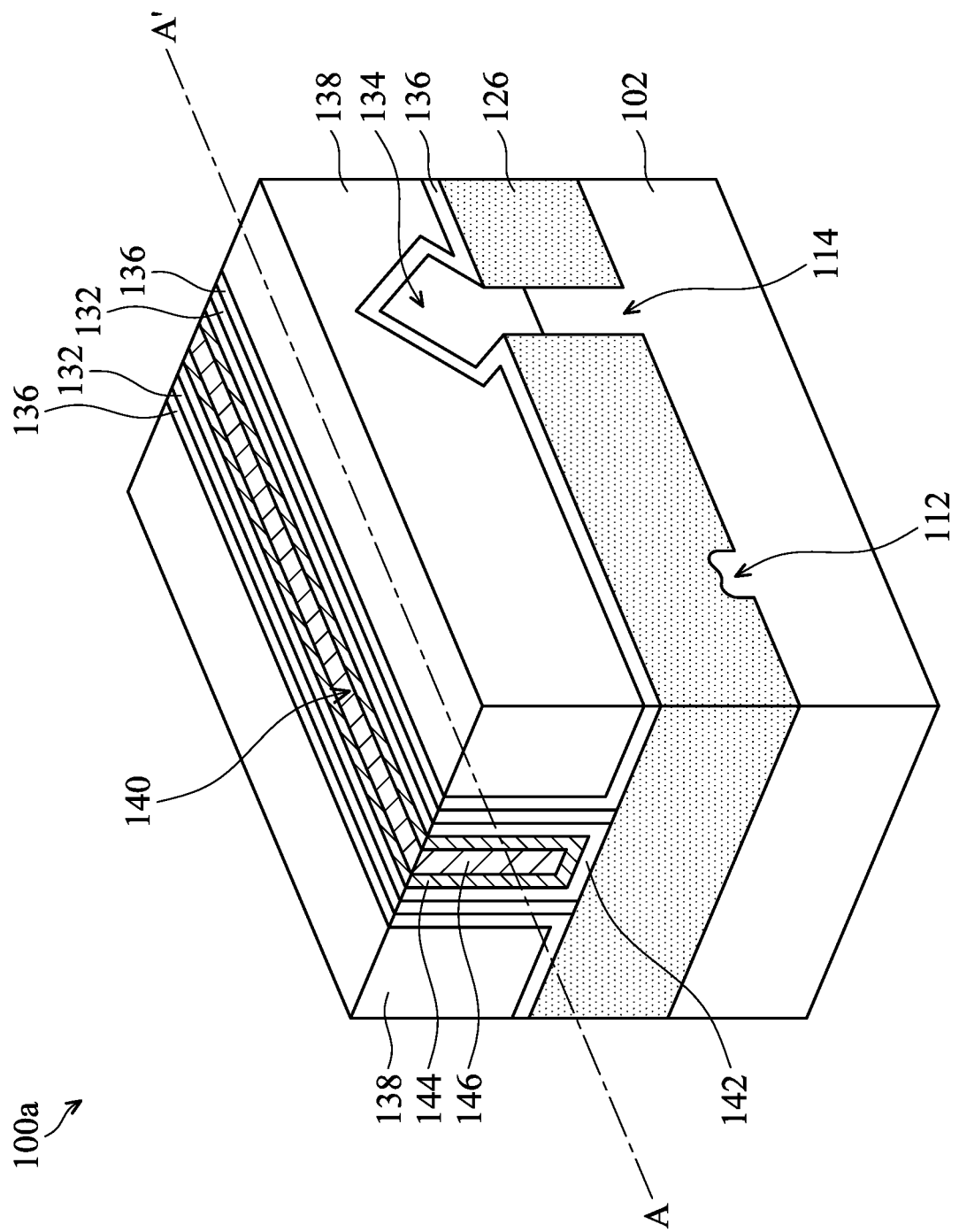

FIGS. 1A-1 to 1N-2 are perspective and cross-sectional representations of various stages of forming a semiconductor structure 100a in accordance with some embodiments. More specifically, FIG. 1A-1 to 1N-1 are perspective representations of semiconductor structure 100a at various stages of fabrication, and FIG. 1A-2 to 1N-2 are cross-sectional representations of semiconductor structure 100a taken along line A-A' of FIG. 1A-1 to 1N-1 in accordance with some embodiments.

Figures 1, 1B, 2:
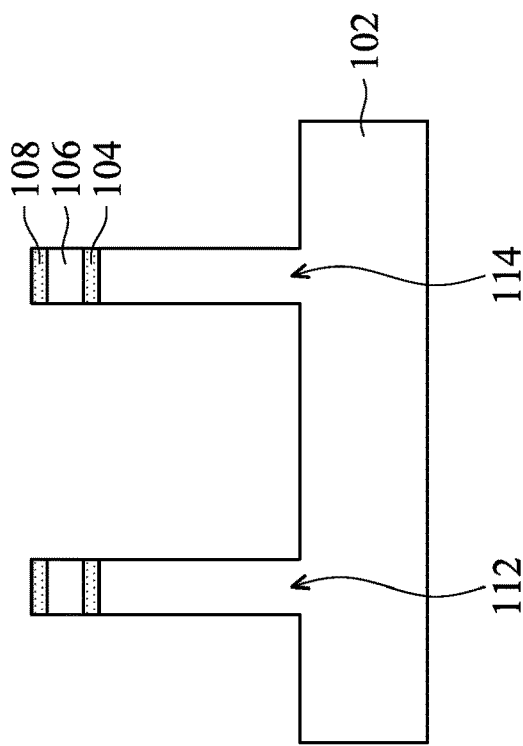
Figures 1, 1A, 2:
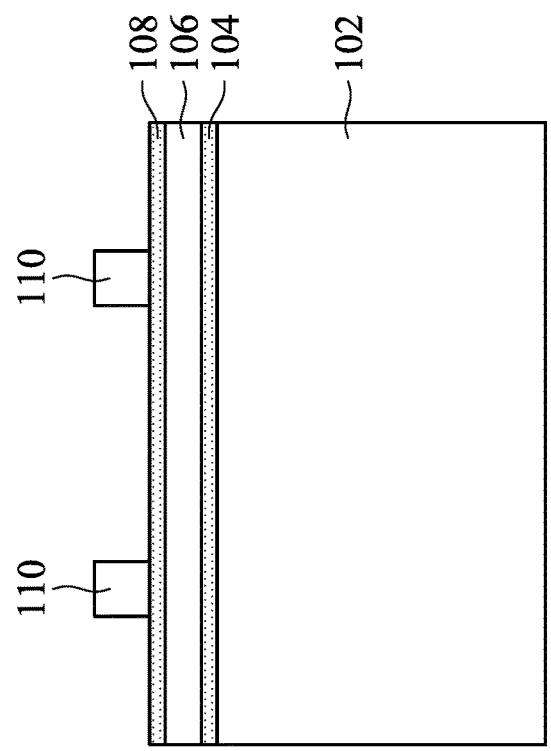
Figures 1, 1D, 2:
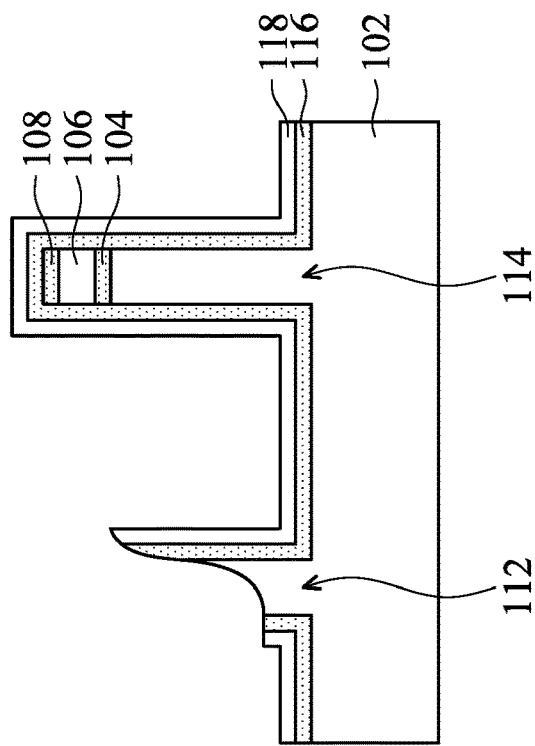
Figures 1, 1C, 2:
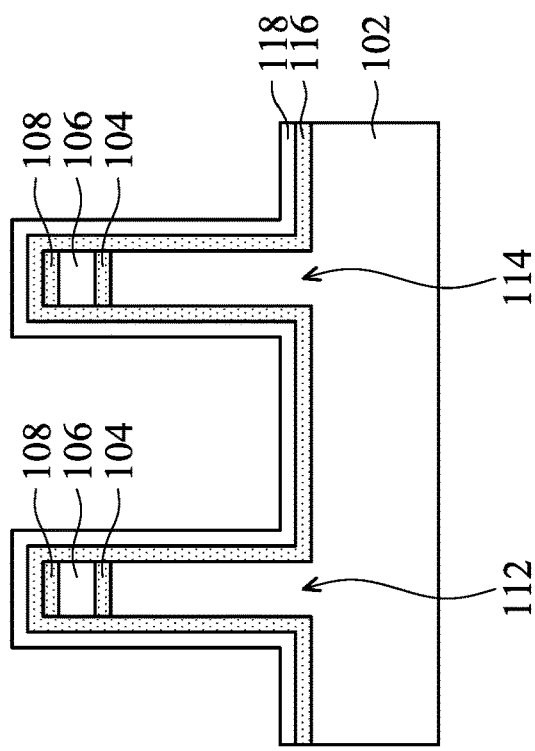
Figures 1, 1F, 2:
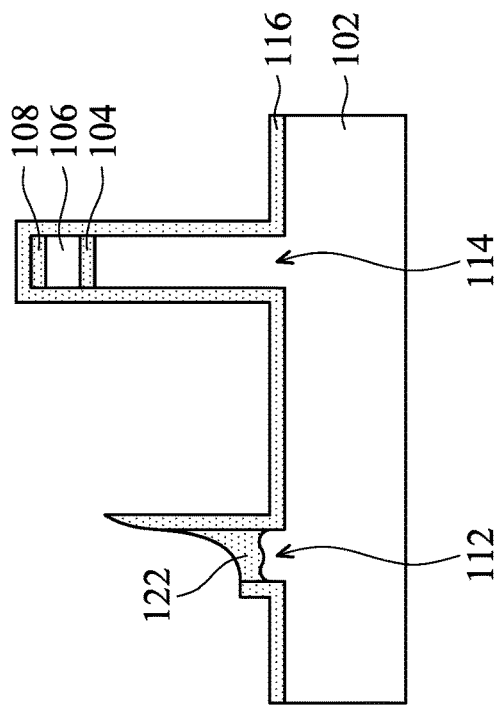
Figures 1, 1E, 2:
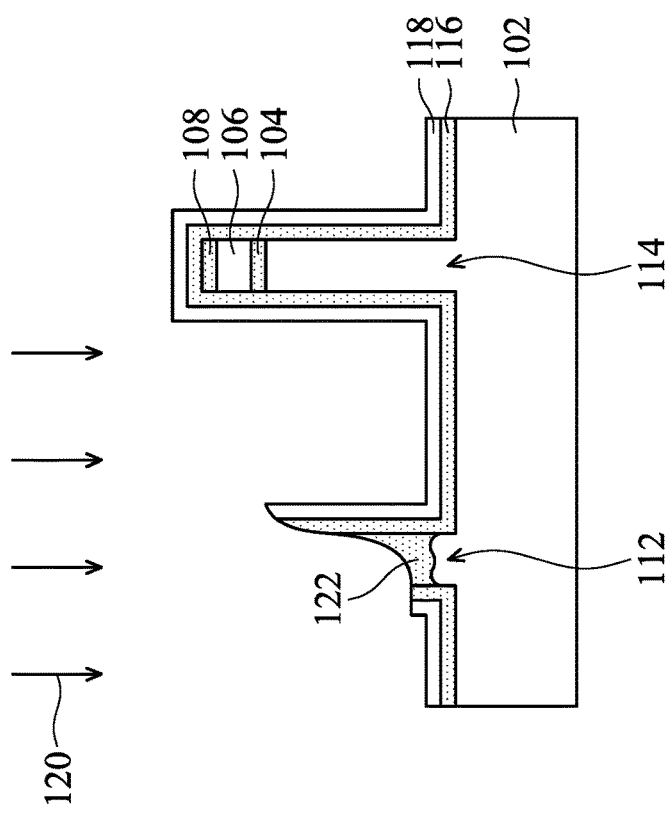
Figures 1, 1H, 2:
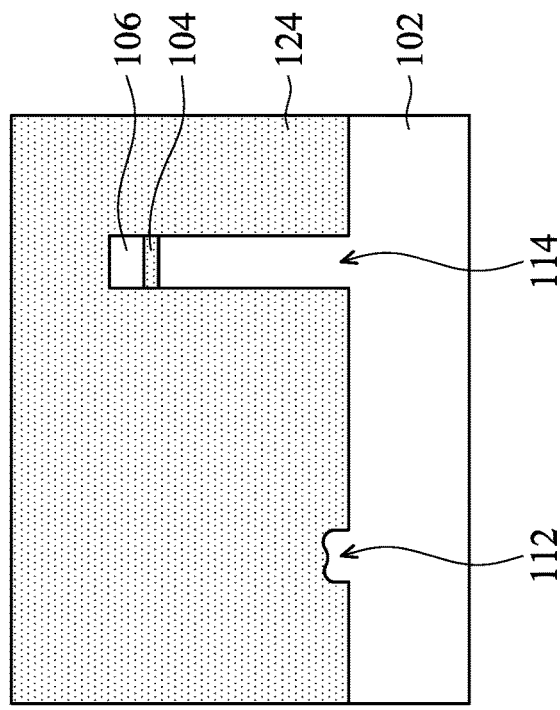
Figures 1, 1G, 2:
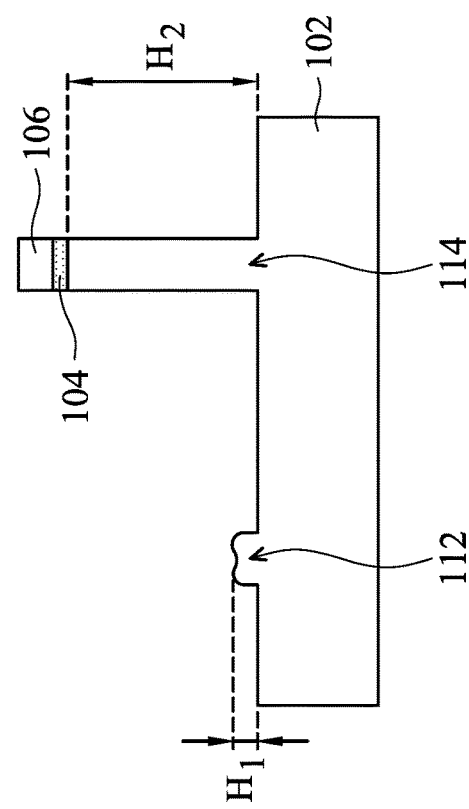
Figures 1, 1I, 1J, 2:
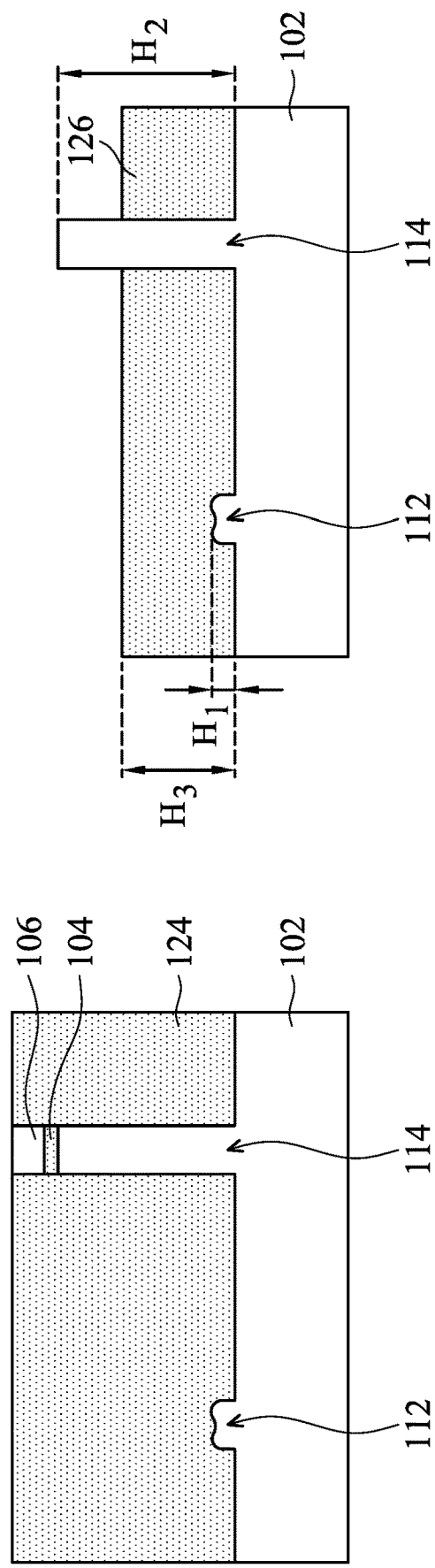
Figures 1, 1L, 2:
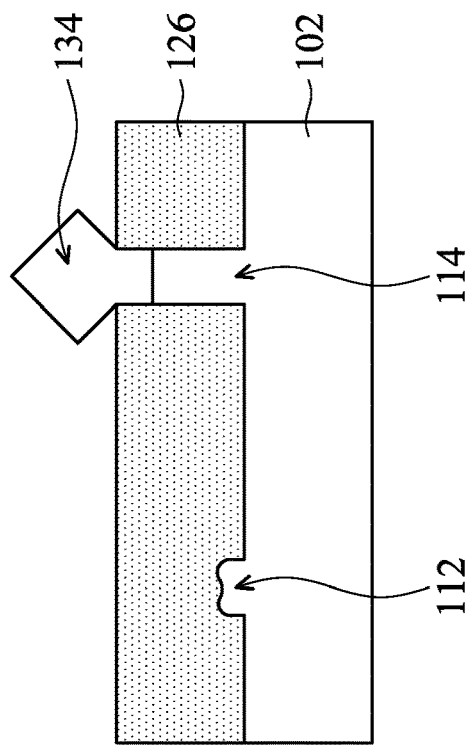
Figures 1, 1K, 2:
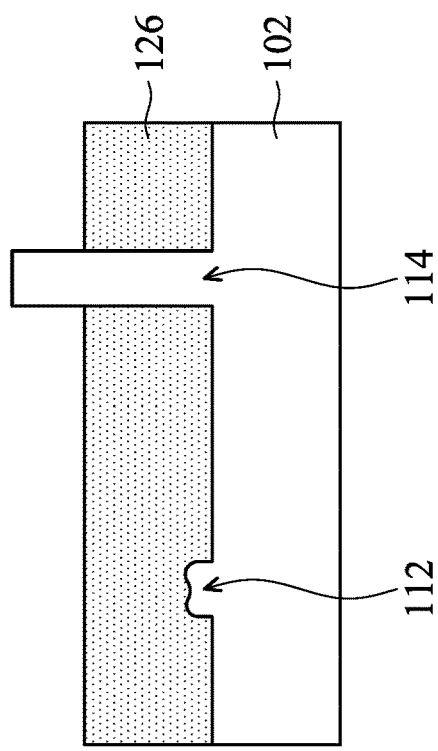
Figures 1, 1N, 2:
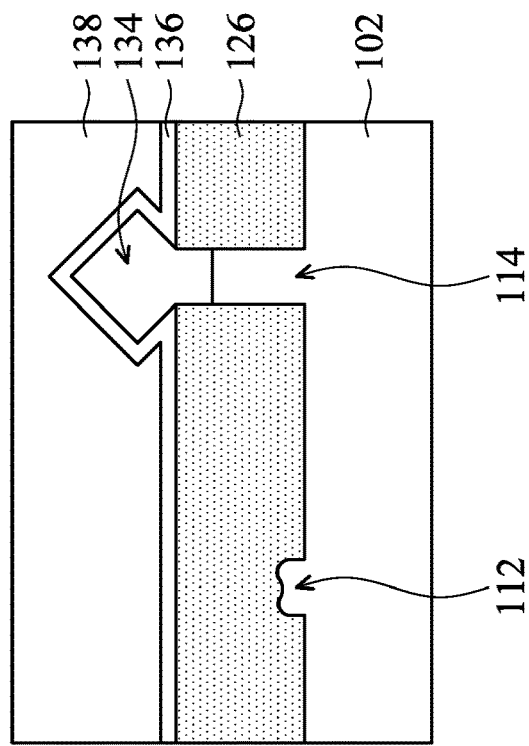
Figures 1, 1M, 2:
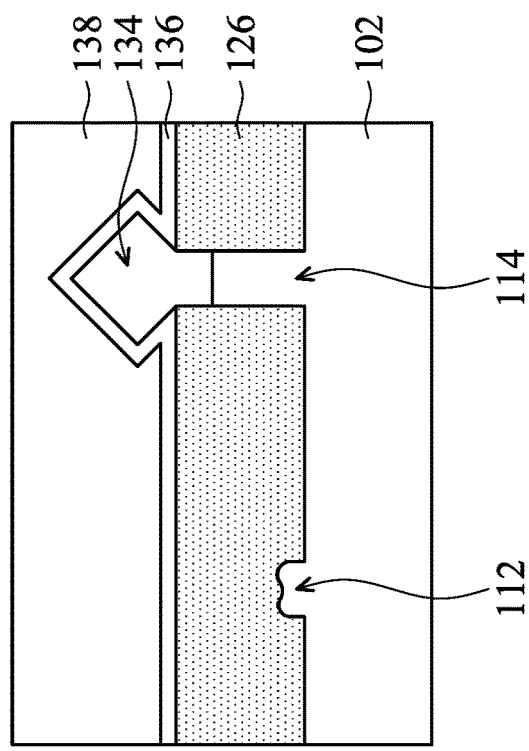

As shown in FIGS. 1A-1 and 1A-2, a substrate 102 is provided in accordance with some embodiments. In some embodiments, substrate 102 is a silicon substrate. In some embodiments, substrate 102 is a silicon on insulator (SOI) substrate.

A first hard mask layer 104, a second hard mask layer 106, and a third hard mask layer 108 are formed over substrate 102, and a photo-sensitive layer 110 is formed over third mask layer 108, as shown in FIGS. 1A-1 and 1A-2 in accordance with some embodiments. In some embodiments, first hard mask layer 104 is made of oxide, second hard mask layer 106 is made of nitride, and third hard mask layer 108 is made of oxide. In some embodiments, first hard mask layer 104 and third hard mask layer 108 are made of silicon oxide, and second hard mask layer 106 is made of silicon nitride.

First hard mask layer 104, second hard mask layer 106, and third hard mask layer 108 may be formed by any application deposition processes, such as chemical vapor deposition (CVD), physical vapor deposition (PVD), atomic layer deposition (ALD), high-density plasma CVD (HDPCVD), metal organic CVD (MOCVD), or plasma enhanced CVD (PECVD).

It should be noted that, although first hard mask layer 104, second hard mask layer 106, and third hard mask layer 108 are shown in FIGS. 1A-1 and 1A-2, a single or more hard mask layers may additionally or alternatively be used to pattern substrate 102 in other embodiments, and the scope of the disclosure is not intended to be limiting.

Next, a first fin structure 112 and a second fin structure 114 are formed by sequentially etching third hard mask layer 108, second hard mask layer 106, first hard mask layer 104, and substrate 102 through photo-sensitive layer 110, as shown in FIGS. 1B-1 and 1B-2 in accordance with some embodiments. Afterwards, photo-sensitive layer 110 is removed.

After photo-sensitive layer 110 is removed, a first sidewall layer 116 is formed to cover first fin structure 112 and second fin structure 114, and a second sidewall layer 118 is formed over first sidewall layer 116, as shown in FIGS. 1C-1 and 1C-2 in accordance with some embodiments. First sidewall layer 116 may be used as a buffer layer between the fin structures (e.g. Si structures) and second sidewall layer (e.g. a nitride layer), such that the interface defect or the stress between these two materials can be reduced. In addition, first sidewall layer 116 may further be used as a protection layer for the hard mask layers. As shown in FIG. 1C-2, first sidewall layer 116 is formed over the sidewalls of first fin structure 112 and second fin structure 114 and is also formed over third hard mask layer 108 over the top surfaces of first fin structure 112 and second fin structure 114.

In some embodiments, first sidewall layer 116 has a thickness in a range from about 5 Å to about 30 Å. If the thickness of first sidewall layer 116 is too thin, the function of first sidewall layer 116 described above may not be effective enough. On the other hand, if thickness of first sidewall layer 116 is too thick, the deposition processes (e.g. bottom-anti-reflective coating layer filling) and/or exposure process performed afterwards may become challenging. In some embodiments, first sidewall layer 116 is made of oxide. In some embodiments, first sidewall layer 116 is made of $SiO_2$.

After first sidewall layer 116 is formed, second sidewall layer 118 is formed over first sidewall layer 116. Second sidewall layer 118 is configured to be a protection layer for the fin structures in the subsequent oxidation process.

In some embodiments, second sidewall layer 118 has a thickness in a range from about 5 Å to about 40 Å. If the thickness of second sidewall layer 118 is too thin, the function of second sidewall layer 118 described above may not be effective enough. On the other hand, if thickness of second sidewall layer 118 is too thick, the deposition processes (e.g. bottom-anti-reflective coating layer filling) and/ or exposure process performed afterwards may become challenging. In some embodiments, second sidewall layer 118 is made of nitride. In some embodiments, second sidewall layer 118 is made of silicon nitride (e.g. $Si_3N_4$) or silicon oxynitride (e.g. $SiO_xN_y$).

First sidewall layer 116 and second sidewall layer 118 may be formed by chemical vapor deposition (CVD), low pressure CVD (LPCVD), physical vapor deposition (PVD), atomic layer deposition (ALD), plasma enhanced ALD (PEALD), high density plasma CVD (HDPCVD), metal organic CVD (MOCVD), or plasma enhanced CVD (PECVD).

After first sidewall layer 116 and second sidewall layer 118 are formed, first fin structure 112 is patterned, as shown in FIGS. 1D-1 and 1D-2 in accordance with some embodiments. First fin structure 112 may be patterned by forming a bottom-anti-reflective coating (BARC) layer and forming a photoresist layer over the bottom-anti-reflective coating layer. The photoresist layer may have an opening over first fin structure 112, and the pattern may be transferred to the bottom-anti-reflective coating layer to pattern first fin structure 112 by an etching process. However, the opening of the photoresist layer may not be precisely aligned with first fin structure 112, and therefore first fin structure 112 may not be completely removed after the etching process.

As shown in FIGS. 1D-1 and 1D-2, the top portion of first fin structure 112 and first sidewall layer 116 and second sidewall layer 118 formed over the top portion of first fin structure 112 are etched in accordance with some embodiments. Accordingly, a portion of first fin structure 112 is exposed after the etching process. In addition, second fin structure 114 is covered by first sidewall layer 116 and second sidewall layer 118 and is not exposed.

Next, an oxidation process 120 is performed to oxidize the exposed portion of first fin structure 112, as shown in FIGS. 1E-1 and 1E-2 in accordance with some embodiments. In some embodiments, oxidation process 120 is performed in a furnace with steam. In some embodiments, oxidation process 120 is a thermal oxidation process, an O2 plasma process, a wet oxidation process (such as a scanning probe microscope oxidation process), or a combination thereof.

After oxidation process 120 is performed, an oxide structure 122 is formed over first fin structure 112, as shown in FIGS. 1E-1 and 1E-2 in accordance with some embodiments. More specifically, the exposed portion of first fin structure 112 is oxidized during oxidation process 120, such that the exposed portion of first fin structure 112 is transformed into oxide structure 122.

As shown in FIG. 1E-2, since oxide structure 122 is formed by oxidizing the exposed portion of first fin structure 112, oxide structure 122 is positioned directly on the remaining portion of first fin structure 112 which is not oxidized during oxidation process 120. In addition, since first sidewall layer 116, which may be an oxide layer, is positioned on the sidewalls of first fin structure 112, as shown in FIG. 1D-2, the edge portion of first fin structure 112 tends to be oxidized more than other portions during oxidation process 120. Therefore, the bottom surface of the resulting oxide structure 112 is not flat and the remaining first fin structure 112 has blunt corners at its top portion in accordance with some embodiments. It should be noted that, the shape of remaining silicon blunt corners are formed depending on its original shape and volume before the oxidation process and/or the time and temperature of the oxidation process.

After the exposed portion of first fin structure 112 is oxidized by oxidation process 120, second sidewall layer 118 is removed, as shown in FIGS. 1F-1 and 1F-2 in accordance with some embodiments. Second sidewall layer 118 may be removed by an etching process, such as a wet etching process, a dry etching process, or a combination thereof.

After second sidewall layer 118 is removed, first sidewall layer 116 and oxide structure 122 are removed, as shown in FIGS. 1G-1 and 1G-2 in accordance with some embodiments. First sidewall layer 116 and oxide structure 122 may both be made of oxide and therefore can be removed in the same etching process. In addition, in some embodiments, third hard mask layer 108 is also made of oxide, and therefore third hard mask layer 108 is also removed by the etching process which is used to remove first sidewall layer 116 and oxide structure 122.

As shown in FIG. 1G-2, first fin structure 112 is shortened by oxidizing the exposed portion of first fin structure 112 and removing the oxidized portion (e.g. oxide structure 122) of first fin structure 112. In some embodiments, first fin structure 112 has a first height $H_1$, and second fin structure 114 has a second height $H_2$ which is smaller than first height $H_1$. In addition, as shown in FIG. 1G-2, the top portion of first fin structure 112 has blunt corners due to oxidation process 120.

After first sidewall layer 116 and oxide structure 122 are removed, an insulating layer 124 is formed to cover first fin structures 112 and second fin structure 114 over substrate 102, as shown in FIGS. 1H-1 and 1H-2 in accordance with some embodiments. In some embodiments, insulating layer 124 is made of silicon oxide. Insulating layer 124 may be formed by using a high-density-plasma (HDP) CVD process, although other deposition processes may be used in other embodiments.

After insulating layer 124 is formed, a chemical mechanical polishing (CMP) process is performed to expose the top surface of second hard mask layer 106, as shown in FIGS. 1I-1 and 1I-2 in accordance with some embodiments. Next, insulating layer 124 is further processed to form shallow trench isolation (STI) structure 126 around second fin structure 114, as shown in FIGS. 1J-1 and 1J-2 in accordance with some embodiments. In addition, second hard mask layer 106 and first hard mask layer 104 are removed.

More specifically, shallow trench isolation structure 126 may be formed by recessing insulating layer 124 by a wet or dry etching process, removing second hard mask layer 106, removing first hard mask layer 104, forming a sacrificial layer, forming wells by implanting and annealing processes, removing the sacrificial layer, and further removing the upper portion of insulating layer 124.

As shown in FIG. 1J-2, shallow trench isolation structure 126 has a third height $H_3$, and third height $H_3$ of shallow trench isolation structure 126 is higher than first height $H_1$ of first fin structure 112. However, third height $H_3$ of shallow trench isolation structure 126 is lower than second height $H_2$ of second fin structure 114. Therefore, a top portion of second fin structure 114 is exposed, while first fin structure 112 is covered by shallow trench isolation structure 126.

After shallow trench isolation structure 126 is formed, a gate structure 127 is formed over first fin structures 112 and second fin structure 114, as shown in FIGS. 1K-1 and 1K-2 in accordance with some embodiments. As shown in FIG. 1K-1, gate structure 127 is formed across second fin structures 114 and extends over shallow trench isolation structure 126. In addition, gate structure 127 and first fin structure 112 are separated by shallow trench isolation structure 126.

In some embodiments, gate structure 127 includes a gate dielectric layer 128 and a gate electrode layer 130. In some embodiments, gate dielectric layer 128 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

Gate electrode layer 130 is formed over gate dielectric layer 128 in accordance with some embodiments. Gate electrode layer 130 may include a single layer or multilayer structure. In some embodiments, gate electrode layer 130 is made of polysilicon. Gate structure 127 may be formed by a procedure including deposition, photolithography patterning, and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

A spacer layer 132 is formed on the sidewalls of gate structure 127 in accordance with some embodiments. In some embodiments, spacer layer 132 is made of silicon nitride, silicon oxide, silicon oxynitride, silicon carbide, or other applicable dielectric materials. Spacer layer 132 may include a single layer or multiple layers.

After gate structure 127 is formed, source/drain structures 134 are formed in second fin structure 114, as shown in FIGS. 1L-1 and 1L-2 in accordance with some embodiments. More specifically, source/drain structures 134 may be formed by forming recesses in second fin structure 114 and growing a strained material in the recesses by an epitaxial (epi) process. In addition, the lattice constant of the strained material may be different from the lattice constant of substrate 102. In some embodiments, source/drain structures 134 include Ge, SiGe, InAs, InGaAs, InSb, GaAs, GaSb, InAlP, InP, or the like.

After source/drain structures 134 are formed, a contact etch stop layer (CESL) 136 is formed to cover gate structure 127 over substrate 102, as shown in FIGS. 1M-1 and 1M-2 in accordance with some embodiments. In some embodiments, contact etch stop layer 136 is made of silicon nitride, silicon oxynitride, and/or other applicable materials. Contact etch stop layer 136 may be formed by plasma enhanced CVD, low pressure CVD, ALD, or other applicable processes.

After contact etch stop layer 136 is formed, an inter-layer dielectric (ILD) layer 138 is formed on contact etch stop layer 136 over substrate 102 in accordance with some embodiments. Inter-layer dielectric layer 138 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 128 may be formed by chemical vapor deposition (CVD), physical vapor deposition, (PVD), atomic layer deposition (ALD), spin-on coating, or other applicable processes.

Next, a polishing process is performed to inter-layer dielectric layer 138 and contact etch stop layer 136 to expose the top surface of gate structure 127 in accordance with some embodiments. In some embodiments, inter-layer dielectric layer 138 is planarized by a chemical mechanical polishing (CMP) process until the top surfaces of gate structure 127 is exposed.

After the polishing process is performed, gate structure 127 is replaced by a metal gate structure 140, as shown in FIGS. 1N-1 and 1N-2 in accordance with some embodiments. More specifically, gate structure 127 is removed, such that a trench is formed. In some embodiments, gate electrode layer 130 is removed by a first etching process, and gate dielectric layer 128 is removed by a second etching process after the first etching process is performed. Afterwards, metal gate structure 140 is formed in the trench in accordance with some embodiments.

In some embodiments, metal gate structure 140 includes a gate dielectric layer 142, a work function metal layer 144, and a metal gate electrode layer 146. In some embodiments, gate dielectric layer 142 is made of high k dielectric materials. Examples of the high k dielectric material may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 144 is formed over gate dielectric layer 142 in accordance with some embodiments. Work function metal layer 144 is customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

Metal gate electrode layer 146 is formed over work function metal layer 144 in accordance with some embodiments. In some embodiments, metal gate electrode layer 146 is made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. Gate dielectric layer 142, work function metal layer 144, and metal gate electrode layer 146 may be formed by any applicable process to any applicable thickness.

It should be noted that additional layers may be formed above and/or below gate dielectric layer 142, work function metal layer 144, and metal gate electrode layer 146, such as liner layers, interface layers, seed layers, adhesion layers, barrier layers, or the like. In addition, gate dielectric layer 142, work function metal layer 144, and metal gate electrode layer 146 may include one or more materials and/or one or more layers.

As described above, after the top portion of first fin structure 112 is removed (e.g. etched), first fin structure 112 is further shortened by performing oxidation process 120 to oxidize the exposed portion of first fin structure 112. Accordingly, first height $H_1$ of first fin structure 112 is shorter than second height $H_2$ of second fin structure $H_2$. In addition, first fin structure 112 has blunt corners at its top portion.

Furthermore, shallow trench isolation structure 126 is formed around second fin structure 114 but over first fin structure 112. That is, first fin structure 112 is covered by shallow trench isolation structure 126. Therefore, metal gate structure 140 formed afterwards is positioned directly on second fin structure 114, while metal gate structure 140 and first fin structure are separated by shallow trench isolation structure 126 in accordance with some embodiments.

Figure 2A:
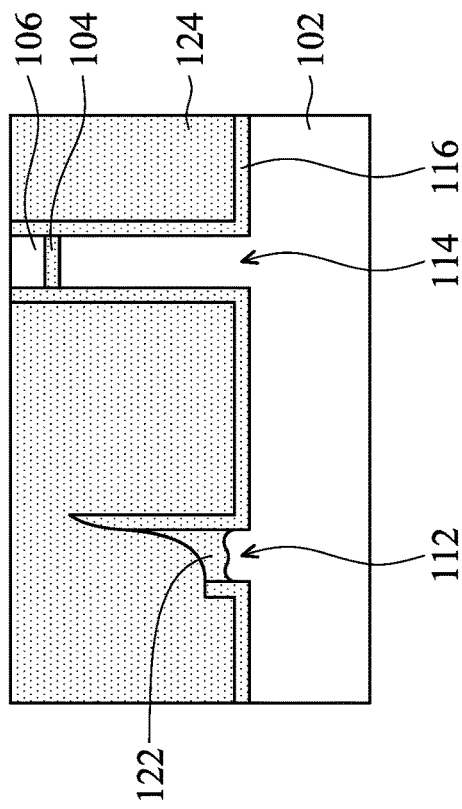
FIGS. 2A to 2C are cross-sectional representations of various stages of forming a semiconductor structure in accordance with some embodiments.
Figure 2B:
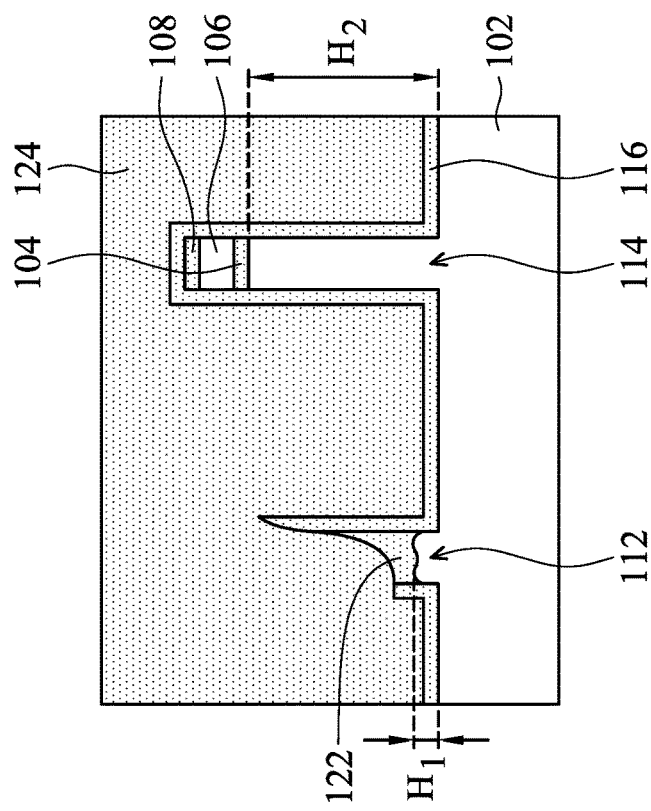
Figure 2C:
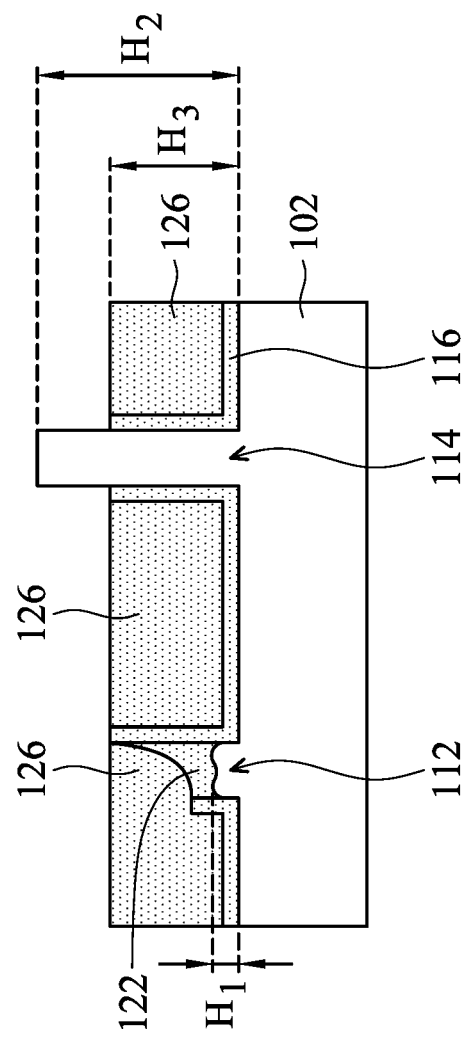
Figure 3:
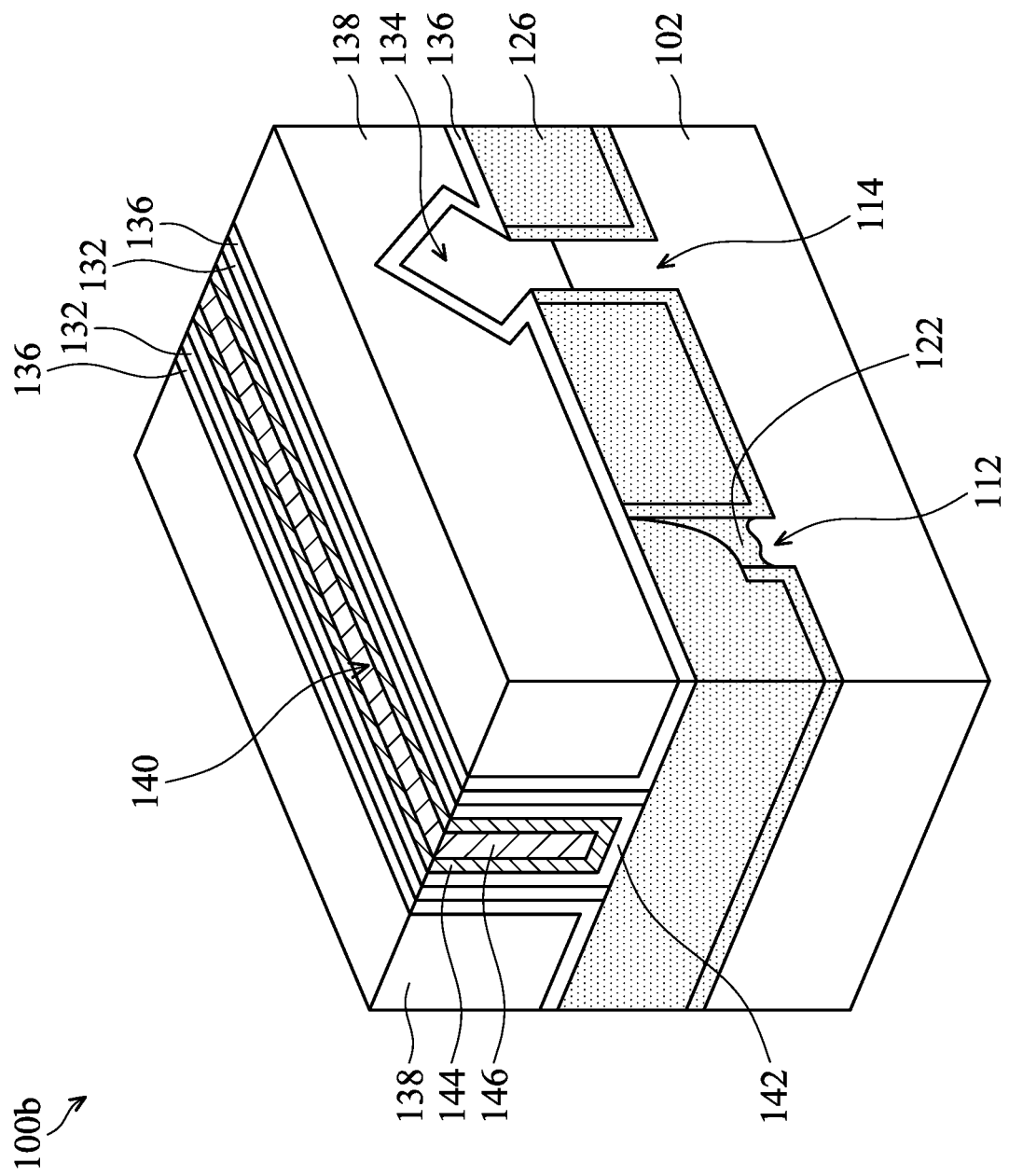
FIG. 3 is a perspective representation of a semiconductor structure formed by the method shown in FIGS. 2A to 2C in accordance with some embodiments.

FIGS. 2A to 2C are cross-sectional representations of various stages of forming a semiconductor structure in accordance with some embodiments. The method used to form the semiconductor structure shown in FIGS. 2A to 2C are similar to, or the same as, that used to form semiconductor structure 100a shown in FIGS. 1A-1 to 1N-2, except first sidewall layer 116 and oxide structure 122 are not removed before shallow trench isolation structure 126 is formed. It should be noted that the processes and materials described previously are not repeated herein. FIG. 3 is a perspective representation of a semiconductor structure 100b formed by the method shown in FIGS. 2A to 2C in accordance with some embodiments.

The processes and materials described above and shown in FIGS. 1A-1 to 1F-2 are performed to form first fin structure 112 and second fin structure 114 over substrate 102. In some embodiments, second height $H_2$ of second fin structure 114 is higher than first height $H_1$ of first fin structure 112. In addition, oxide structure 122 is formed over first fin structure 112, and second sidewall layer 118 is removed afterwards. After second sidewall layer 118 is removed, the processes shown in FIGS. 1I-1 to 1N-2 are performed without removing oxide structure 122 and first sidewall layer 116 beforehand. More specifically, insulating layer 124 is formed to cover first fin structure 112 and second fin structure 114 over substrate 102, as shown in FIG. 2A in accordance with some embodiments. In addition, since oxide structure 122 and first sidewall layer 116 are not removed before insulating layer 124 is formed, insulating layer 124 also covers oxide structure 122 and first sidewall layer 116.

After insulating layer 124 is formed, the upper portion of insulating layer 124 is removed to form shallow trench isolation structure 126. In some embodiments, a chemical mechanical polishing (CMP) process is performed to expose the top surface of second hard mask layer 106, as shown in FIG. 2B. Next, upper portion of insulating layer 124 is recessed to form shallow trench isolation (STI) structure 126 around second fin structure 114, as shown in FIG. 2C in accordance with some embodiments. Since oxide structure 122, first sidewall layer 116, and insulating layer 124 are all made of oxide, oxide structure 122 and first sidewall layer 116 are also etched during the etching process used to recess insulating layer 124.

Similar to that in FIG. 1J-2, shallow trench isolation structure 126 has third height $H_3$ which is higher than first height $H_1$ of first fin structure 112 but lower than second height $H_2$ of second fin structure $H_2$ in accordance with some embodiments.

After shallow trench isolation structure 126 is formed, source/drain structures 134, contact etch stop layer 136, inter-layer dielectric layer 138, and metal gate structure 140 are also formed over substrate 102, as shown in FIG. 3 in accordance with some embodiments. In addition, metal gate structure 140 includes gate dielectric layer 142, work function metal layer 144, and metal gate electrode layer 146 in accordance with some embodiments. In some embodiments, metal gate structure 140 is formed by forming gate structure 127 and replacing the gate structure 127 by metal gate structure 140 as described previously.

Similar to semiconductor structure 100a, first fin structure 112 is shortened by performing oxidation process 120 to oxidize the exposed portion of first fin structure 112. Accordingly, first height $H_1$ of first fin structure 112 is shorter than second height $H_2$ of second fin structure $H_2$. In addition, first fin structure 112 has blunt corners at its top portion.

Furthermore, shallow trench isolation 126 is formed around second fin structure 114 but over first fin structure 112. That is, first fin structure 112 is covered by shallow trench isolation 126, and first fin structure 112 of semiconductor structure 100b is separated from metal gate structure 140 by shallow trench isolation structure 126. In addition, since oxide structure 122 is not removed before shallow trench isolation structure 126 is formed, first fin structure 112 of semiconductor structure 100b and metal gate structure 140 are also separated by oxide structure 122.

Moreover, first sidewall layer 116 is not removed before shallow trench isolation structure 126 is formed either. Therefore, first sidewall layer 116 remains on the sidewalls of oxide structure 122 and further extends onto the sidewalls of first fin structure 112 in accordance with some embodiments. In some embodiments, oxide structure is in direct contact with metal gate structure 140. In some embodiments, first sidewall layer 116 is in direct contact with metal gate structure 140.

Figure 4B:
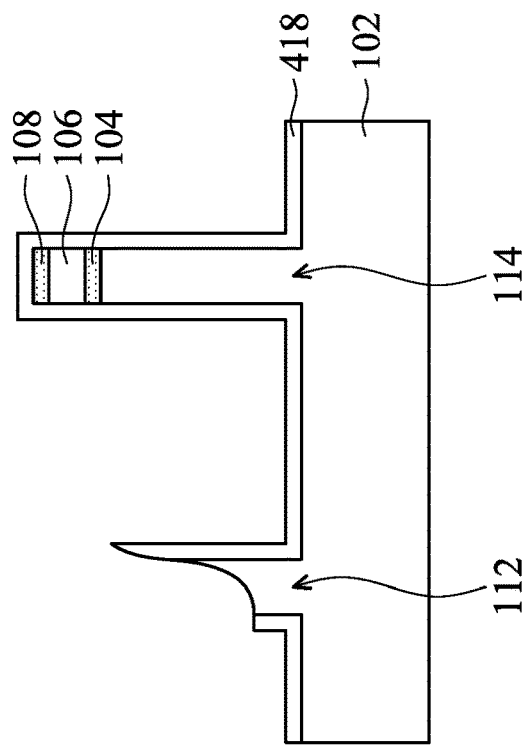
FIGS. 4A to 4G are cross-sectional representations of various stages of forming a semiconductor structure in accordance with some embodiments.

FIGS. 4A to 4G are cross-sectional representations of various stages of forming a semiconductor structure in accordance with some embodiments. FIG. 5 is a perspective representation of a semiconductor structure 100c formed by the method shown in FIGS. 4A to 4G in accordance with some embodiments. It should be noted that the processes and materials described previously are not repeated herein.

Figure 4A:
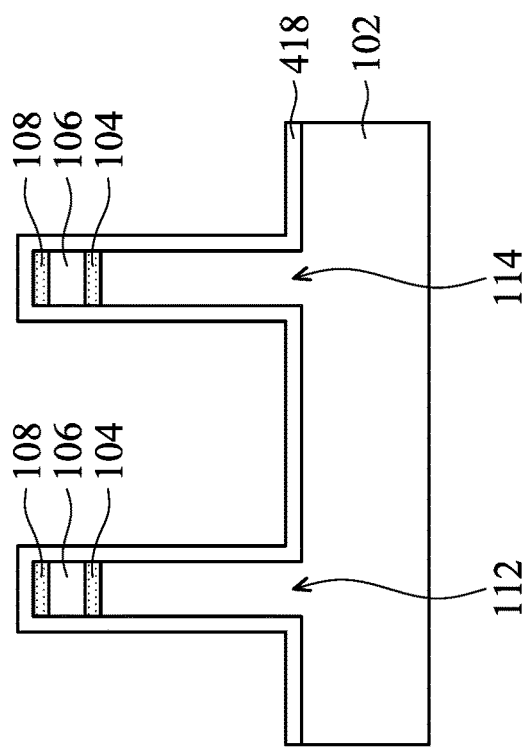
Figure 4C:
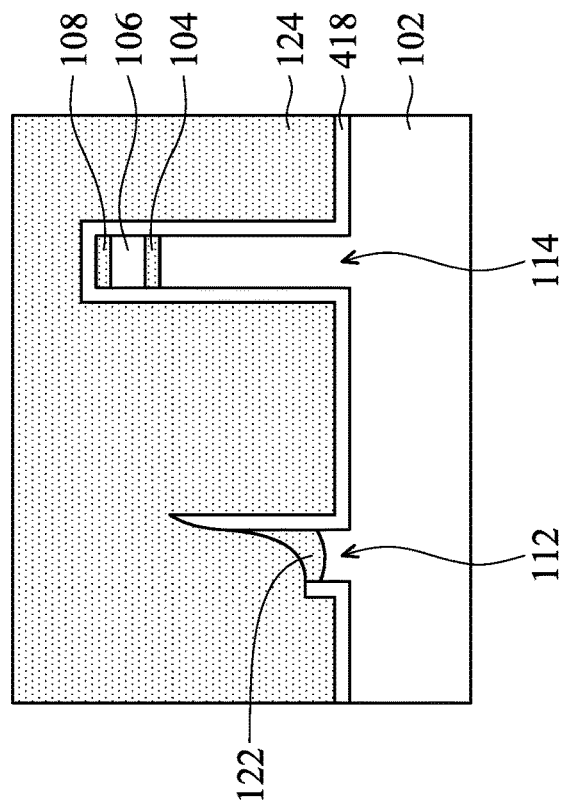
Figure 4D:
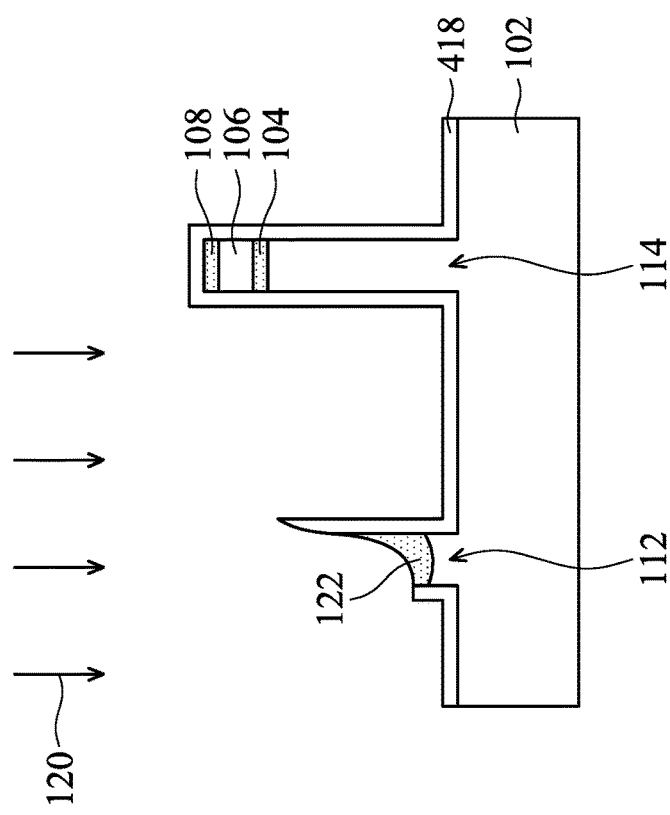
Figure 4F:
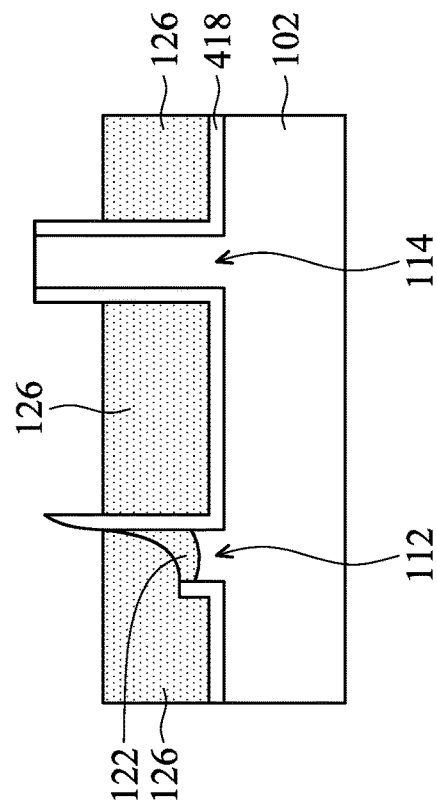
Figure 4E:
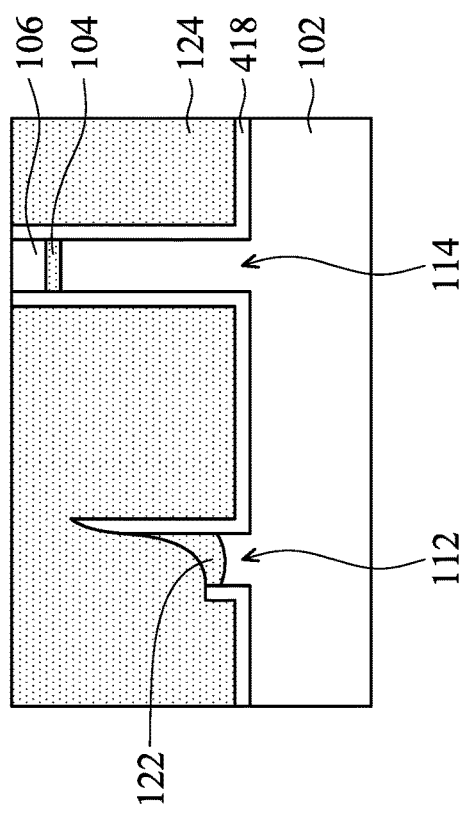
Figure 4G:
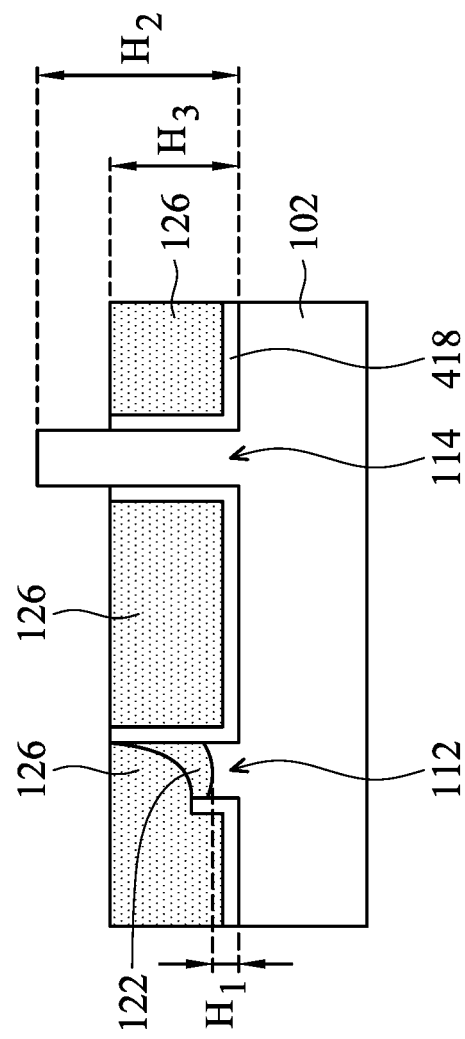
Figure 5:
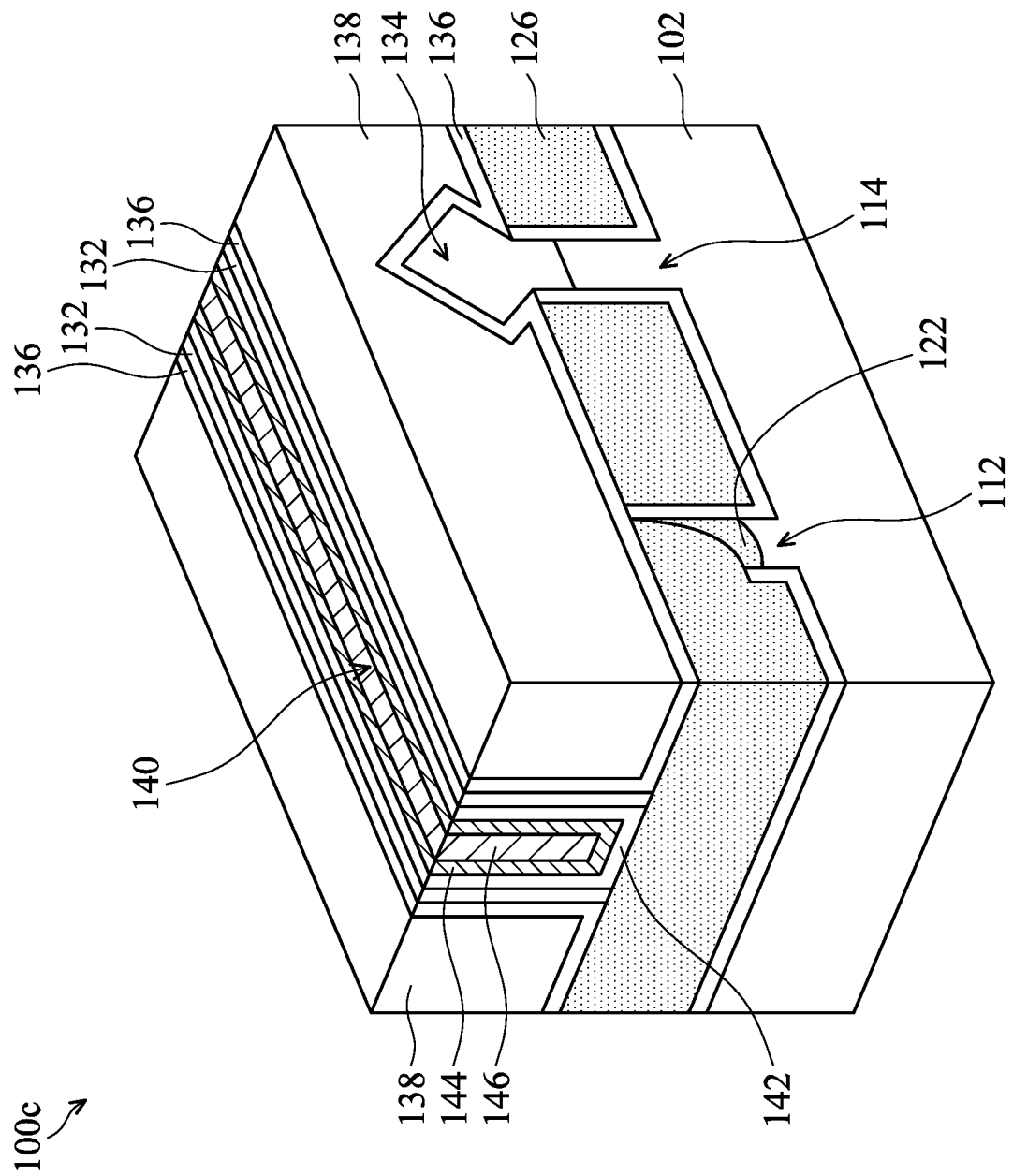
FIG. 5 is a perspective representation of a semiconductor structure formed by the method shown in FIGS. 4A to 4G in accordance with some embodiments.

The method used to form semiconductor structure 100c shown in FIGS. 4A to 5 may be similar to that used to form semiconductor structures 100a and 100b, but only one sidewall layer, instead of two sidewall layers, is formed in accordance with some embodiments. In addition, the sidewall layer used to form semiconductor structure 100c may be similar to, or the same as, second sidewall layer 118 described previously.

More specifically, similar to those shown in FIGS. 1A-2 to 1B-2, first mask layer 104, second mask layer 106, third mask layer 108, and substrate 102 are patterned to form first fin structure 112 and second fin structure 114, as shown in FIG. 4A in accordance with some embodiments. After first fin structure 112 and second fin structure 114 is formed, a third sidewall layer 418 is also formed over substrate 102 to cover first fin structure 112 in accordance with some embodiments. Third sidewall layer 418 may be used to protect the fin structures during the subsequent oxidation process.

In some embodiments, third sidewall layer 418 has a thickness in a range from about 5 Å to about 40 Å. If the thickness of third sidewall layer 418 is too thin, the function of third sidewall layer 418 described above may not be effective enough. On the other hand, if the thickness of third sidewall layer 418 is too thick, the deposition processes (e.g. bottom-anti-reflective coating layer filling) and/or exposure process performed afterwards may be difficult.

Methods and materials used to form third sidewall layer 418 may be the same as those used to form second sidewall layer 118 described previously. In some embodiments, third sidewall layer 418 is made of nitride. In some embodiments, third sidewall layer 418 is made of $Si_3N_4$ or $SiO_xN_y$.

After third sidewall layer 418 is formed, first fin structure 112 is patterned, as shown in FIG. 4B in accordance with some embodiments. As shown in FIG. 4B, the top portion of first fin structure 112 and third sidewall layer 418 formed over the top portion of first fin structure 112 are etched in accordance with some embodiments. After the patterning process, a portion of first fin structure 112 is exposed, while second fin structure 114 is still covered by third sidewall layer 418.

Next, oxidation process 120 is performed to oxidize the exposed portion of first fin structure 112, as shown in FIG. 4C in accordance with some embodiments. The exposed portion of first fin structure 112 is oxidized during oxidation process 120, such that the exposed portion of first fin structure 112 is transformed into oxide structure 122 formed over first fin structure 112.

After the exposed portion of first fin structure 112 is oxidized by oxidation process 120, insulating layer 124 is formed to cover first fin structures 112 and second fin structure 114 over substrate 102, as shown in FIG. 4D in accordance with some embodiments.

Next, the upper portion of insulating layer 124 is removed to form shallow trench isolation structure 126 around second fin structure 114. In some embodiments, a chemical mechanical polishing (CMP) process is performed to expose the top surface of second hard mask layer 106, as shown in FIG. 4E in accordance with some embodiments. Next, the structure is further processed (e.g. recessing insulating layer 124) to form shallow trench isolation (STI) structure 126, as shown in FIG. 4F in accordance with some embodiments. In addition, second hard mask layer 106 and first hard mask layer 104 formed over second fin structure 114 are also removed.

In some embodiments, the top portion of oxide structure 122 is also removed during the etching process used to recess insulating layer 124. However, third sidewall layer 418 is not removed in the etching process. Therefore, some portions of third sidewall layer 418 are exposed and extend above the top surface of shallow trench isolation structure 126, as shown in FIG. 4F.

Accordingly, an extra etching process is performed to remove the extending portions of third sidewall layer 418, as shown in FIG. 4G in accordance with some embodiments. However, although the extending portions of third sidewall layer 418 are removed after the etching process, the portions of third sidewall layer 418 embedded in shallow trench isolation structure 126 are not removed. That is, the portions of third sidewall layer 418 formed on the sidewalls of oxide structure 122 are left in shallow trench isolation structure 126.

Similar to that in FIG. 1J-2, shallow trench isolation structure 126 has third height $H_3$ which is higher than first height $H_1$ of first fin structure 112 but lower than second height $H_2$ of second fin structure $H_2$ in accordance with some embodiments.

After the extending portions of third sidewall layer 418 is removed, source/drain structures 134, contact etch stop layer 136, inter-layer dielectric layer 138, and metal gate structure 140 are also formed over substrate 102, as shown in FIG. 5 in accordance with some embodiments. In addition, metal gate structure 140 includes gate dielectric layer 142, work function metal layer 144, and metal gate electrode layer 146 in accordance with some embodiments.

Similar to that of semiconductor structures 100a and 100b, first fin structure 112 is shortened by performing oxidation process 120 to oxidize the exposed portion of first fin structure 112. Accordingly, first height $H_1$ of first fin structure 112 is shorter than second height $H_2$ of second fin structure $H_2$. Furthermore, shallow trench isolation 126 is formed around second fin structure 114 but over first fin structure 112. That is, first fin structure 112 is covered by shallow trench isolation 126, and first fin structure 112 of semiconductor structure 100c is also separated from metal gate structure 140 by shallow trench isolation structure 126.

In addition, since oxide structure 122 is not removed before shallow trench isolation structure 126 is formed, first fin structure 112 of semiconductor structure 100c and metal gate structure 140 are also separated by oxide structure 122. In some embodiments, oxide structure is in direct contact with metal gate structure 140.

Moreover, third sidewall layer 418 is not removed before shallow trench isolation structure 126 is formed either. Therefore, third sidewall layer 418 remains formed on the sidewalls of oxide structure 122 and further extends onto the sidewalls of first fin structure 112 in accordance with some embodiments. In some embodiments, third sidewall layer 418 is in direct contact with metal gate structure 140.

Figure 6A:
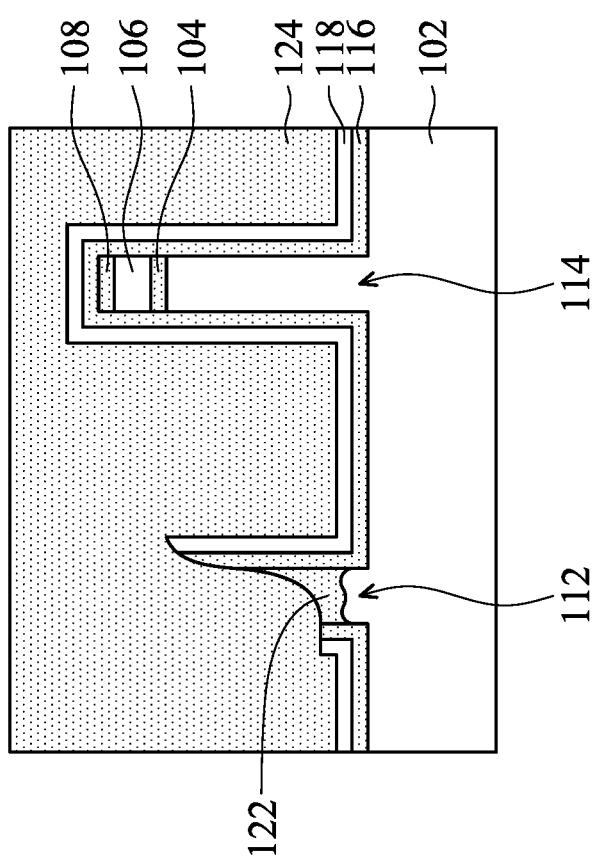
FIGS. 6A and 6B are cross-sectional representations of forming a semiconductor structure in accordance with some embodiments.
Figure 6B:
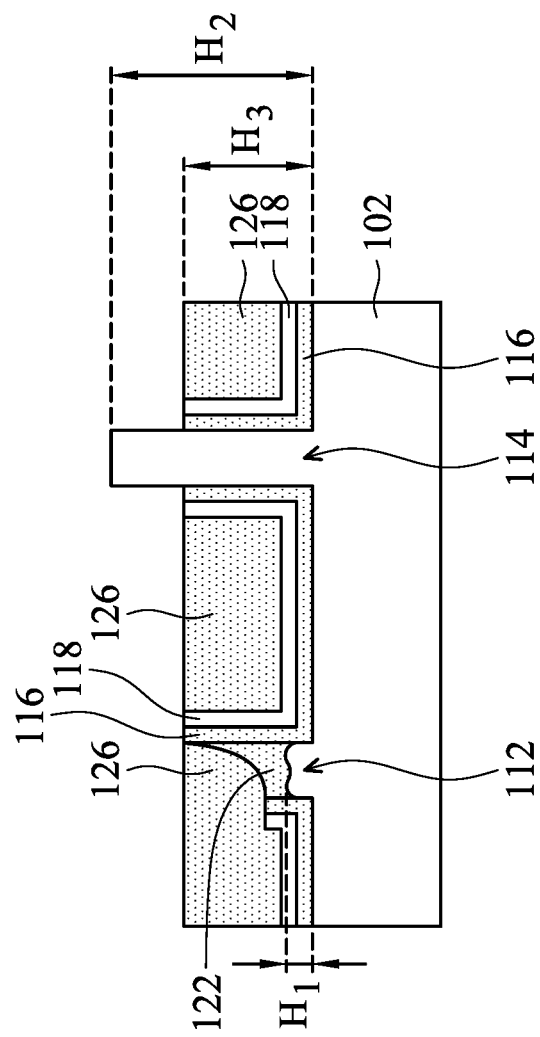
Figure 7:
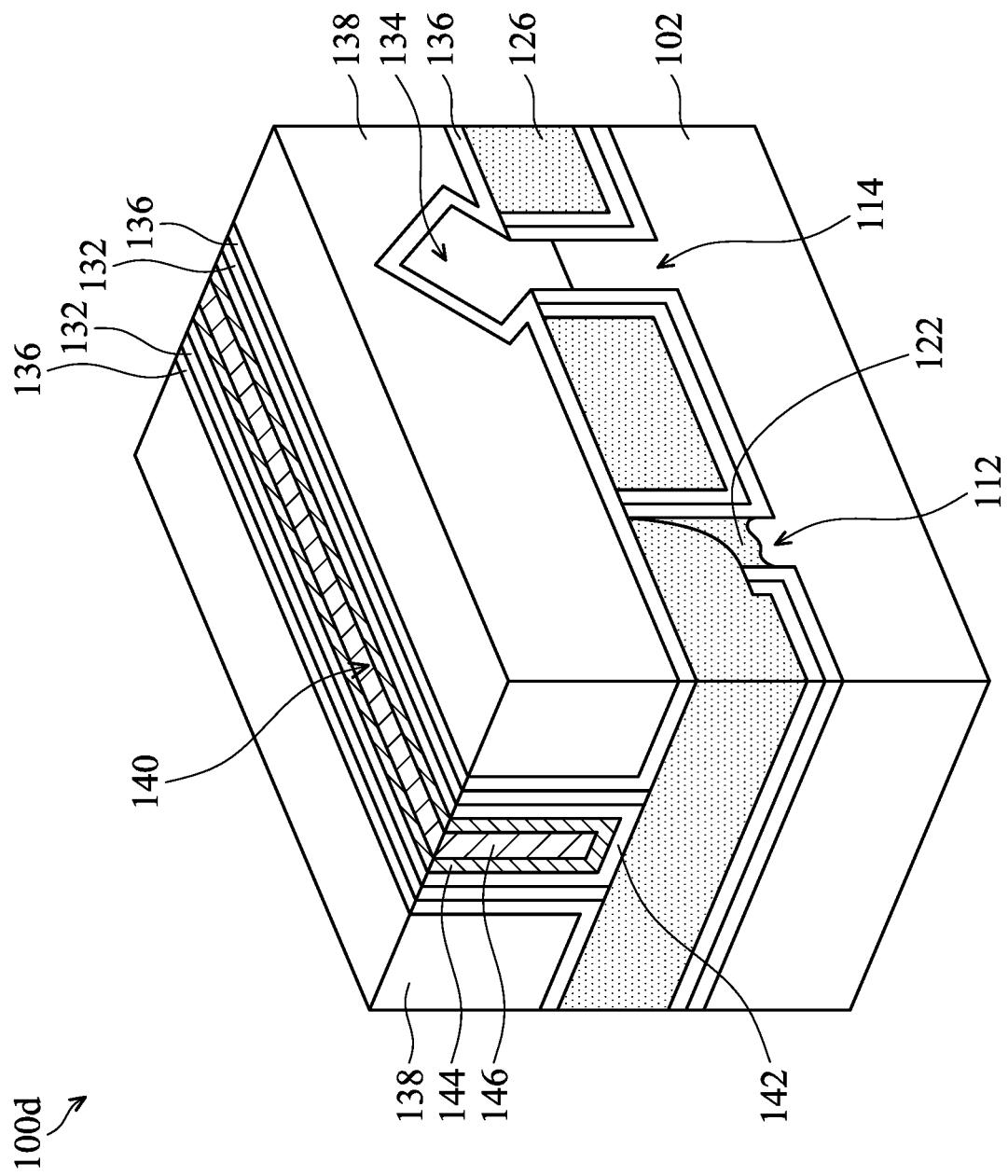
FIG. 7 is a perspective representation of a semiconductor structure formed by the method shown in FIGS. 6A to 6C in accordance with some embodiments.

FIGS. 6A and 6B are cross-sectional representations of forming a semiconductor structure in accordance with some embodiments. FIG. 7 is a perspective representation of a semiconductor structure 100d formed by the method shown in FIGS. 6A to 6C in accordance with some embodiments. The processes and materials described previously are not repeated herein.

The method used to form semiconductor structure 100d shown in FIGS. 6A to 7 may be similar to that used to form semiconductor structures 100a, 100b, and 100c, but second sidewall layer 118 is not removed before shallow trench isolation structure 126 is formed in accordance with some embodiments.

More specifically, similar to the structures shown in FIGS. 1A-2 to 1E-2, first fin structure 112 and second fin structure 114 are formed over substrate 102, and first sidewall layer 116 and second sidewall layer 118 are formed over first fin structure 112 and second fin structure 114. Next, first fin structure 112 is patterned, and the exposed portion of first fin structure 112 is oxidized to form oxide structure 122 over the unreacted (i.e. un-oxidized) first fin structure 112. In addition, first fin structure 112 has blunt corners at its top portion.

After the exposed portion of first fin structure 112 is oxidized by oxidation process 120, insulating layer 124 is formed to cover first fin structure 112 and second fin structure 114 over substrate 102, as shown in FIG. 6A in accordance with some embodiments.

Next, the structure is further processed to form shallow trench isolation (STI) structure 126 around second fin structure 114, as shown in FIG. 6B in accordance with some embodiments. Similar to the processes described previously and shown in FIGS. 4D to 4G, the upper portion of insulating layer 124 is removed to form shallow trench isolation structure 126 and second hard mask layer 106 and first hard mask layer 104 formed over second fin structure 114 are also removed. In addition, the portions of first sidewall layer 116 and second sidewall layer 118 extending over shallow trench isolation structure 126 are further removed. In some embodiments, the top portion of oxide structure 122 is also removed during the etching process used to recess insulating layer 124.

Similar to that in FIG. 1J-2, shallow trench isolation structure 126 has third height $H_3$ which is higher than first height $H_1$ of first fin structure 112 but lower than second height $H_2$ of second fin structure $H_2$ in accordance with some embodiments.

Afterwards, source/drain structures 134, contact etch stop layer 136, inter-layer dielectric layer 138, and metal gate structure 140 are also formed over substrate 102, as shown in FIG. 7 in accordance with some embodiments. In addition, metal gate structure 140 includes gate dielectric layer 142, work function metal layer 144, and metal gate electrode layer 146 in accordance with some embodiments.

Similar to that of semiconductor structures 100a, 100b, and 100c, first fin structure 112 of semiconductor structure 100d is also separated from metal gate structure 140 by shallow trench isolation structure 126. In addition, since oxide structure 122 is not removed before shallow trench isolation structure 126 is formed, first fin structure 112 of semiconductor structure 100d and metal gate structure 140 are also separated by oxide structure 122. In some embodiments, oxide structure 122 is in direct contact with metal gate structure 140.

Furthermore, first sidewall layer 116 and second sidewall layer 118 are not removed before shallow trench isolation structure 126 is formed, either. Therefore, first sidewall layer 116 and second sidewall layer 118 remain formed on the sidewalls of oxide structure 122 and further extend onto the sidewalls of first fin structure 112 in accordance with some embodiments. In some embodiments, first sidewall layer 116 and second sidewall layer 118 are both in direct contact with metal gate structure 140.

When fin structures are formed in a manufacturing process, a number of fin structures may be formed at the same time, and some of them may need to be removed by performing additional etching processes afterwards. However, after the etching process, some portions of the fin structures which are designed to be removed may not be completely removed. These remaining portions of the fin structures may result in short circuit and reducing manufacturing yield.

Accordingly, as described previously, oxidation process 120 is performed to the remaining portion of first fin structure 112 after the etching process has been used to pattern first fin structure 112 in accordance with some embodiments. By using oxidation process 120, the exposed portion of first fin structure 112 is oxidized and transformed into oxide structure 122, and first fin structure 112 is shortened. Therefore, first fin structure 112 is separated from metal gate structure 140 by shallow trench isolation structure 126. Accordingly, the risks of the short circuit between metal gate structure 140 and first fin structure 112 can be reduced, and the yield of the manufacturing process is improved.

Embodiments of a semiconductor structure and methods for forming the semiconductor structures are provided. The semiconductor structure includes a first fin structure and a second fin structure. A portion of the first fin structure is exposed by an etching process, and the exposed portion of the first fin structure is oxidized by an oxidation process. During the oxidation process, the exposed portion of the first fin structure is oxidized and transformed into an oxide structure. Accordingly, the first fin structure is shortened by the oxidation process, and the risks of a short circuit between the first fin structure and a gate structure formed thereon can be reduced.

In some embodiments, a semiconductor structure is provided. The semiconductor structure includes a substrate and a first fin structure and a second fin structure formed over the substrate. The semiconductor structure further includes an isolation structure formed adjacent to the second fin structure and covering the first fin structure and a gate structure formed over the first fin structure and the second fin structure. In addition, the first fin structure is lower than the second fin structure, and the first fin structure has a curved top surface under the isolation structure.

In some embodiments, a semiconductor structure is provided. The semiconductor structure includes a substrate and a first fin structure and a second fin structure formed over the substrate. In addition, the second fin structure is higher than the first fin structure. The semiconductor structure further includes an oxide structure covering the first fin structure and a gate structure formed over the first fin structure and the second fin structure. In addition, the oxide structure has a curved surface.

In some embodiments, a semiconductor structure is provided. The semiconductor structure includes a substrate and a first fin structure and a second fin structure formed over the substrate. The semiconductor structure further includes an isolation structure formed around the second fin structure and covering a top surface of the first fin structure and a gate structure formed over the first fin structure and the second fin structure. In addition, the top surface of the first fin structure is not flat.

In some embodiments, a semiconductor structure is provided. The semiconductor structure includes a substrate and a first fin structure and a second fin structure formed over the substrate. In addition, the second fin structure is higher than the first fin structure. The semiconductor structure further includes an isolation structure formed around the second fin structure and covering a top surface of the first fin structure and a gate structure formed over the first fin structure and the second fin structure. In addition, the top surface of the first fin structure is not flat.

In some embodiments, a semiconductor structure is provided. The semiconductor structure includes a substrate and a first fin structure and a second fin structure formed over the substrate. In addition, the second fin structure is higher than the first fin structure. The semiconductor structure further includes an oxide structure covering the first fin structure and a gate structure formed over the first fin structure and the second fin structure. In addition, an interface between the oxide structure and the first fin structure is a curved surface.

In some embodiments, a semiconductor structure is provided. The semiconductor structure includes a substrate and a fin structure over the substrate. The semiconductor structure further includes a patterned fin structure adjacent to the fin structure over the substrate. In addition, the fin structure is higher than the patterned fin structure, and the patterned fin structure has a tip portion at a first edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a first fin structure and a second fin structure formed over the substrate, wherein a top surface of the second fin structure is higher than a top surface of the first fin structure, wherein the first fin structure has a first sidewall and a second sidewall, the second fin structure has a third sidewall and a fourth sidewall, a bottom of the first sidewall being substantially level with a bottom of the third sidewall;
an isolation structure formed around the second fin structure and covering the top surface of the first fin structure; and
a gate structure formed over the first fin structure and the second fin structure,
wherein the top surface of the first fin structure is not flat, and the first fin structure has a tip at its edge and wherein the first fin structure has a curved surface, and a first end of the curved surface is higher than a second end of the curved surface, wherein the curved surface is a concave curved surface, wherein the first sidewall of the first fin structure is shorter than the second sidewall of the first fin structure, wherein the tip is at an intersection of the concave curved surface and the second sidewall, the tip being a highest point of the first fin structure.

2. The semiconductor structure as claimed in claim 1, further comprising:
a source/drain structure formed over the second fin structure,
wherein a bottom surface of the source/drain structure is higher than the top surface of the first fin structure.

3. The semiconductor structure as claimed in claim 1, further comprising:
a sidewall layer formed on the second sidewall of the first fin structure and continuously extending onto the third sidewall of the second fin structure, the sidewall layer extending to an upper surface of the first fin structure.

4. The semiconductor structure as claimed in claim 1, wherein an edge portion of the first fin structure is higher than a center portion of the first fin structure.

5. The semiconductor structure as claimed in claim 1, wherein the gate structure is in direct contact with the second fin structure but is separated from the first fin structure.

6. The semiconductor structure as claimed in claim 1, wherein the top surface of the first fin structure has a concave shape in a cross-sectional view.

7. The semiconductor structure of claim 1, further comprising:
an oxide structure between the isolation structure and the first fin structure, wherein the second fin structure protrudes above an upper surface of the isolation structure.

8. A semiconductor structure, comprising:
a substrate;
a patterned semiconductor structure and a fin structure formed over the substrate, wherein an upper surface of the fin structure is higher than an upper surface of the patterned semiconductor structure, wherein a first sidewall of the patterned semiconductor structure is shorter than a second sidewall of the patterned semiconductor structure;
an insulating structure covering the patterned semiconductor structure; and
a gate structure formed over the patterned semiconductor structure and the fin structure,
wherein a surface of the patterned semiconductor structure at an interface between the insulating structure and the patterned semiconductor structure is a concave curved surface,
wherein the concave curved surface intersects the first sidewall or the second sidewall of the patterned semiconductor structure.

9. The semiconductor structure as claimed in claim 8, wherein the interface between the insulating structure and the patterned semiconductor structure is lower than the upper surface of the fin structure.

10. The semiconductor structure as claimed in claim 8, further comprising:
a source/drain structure formed over the fin structure,
wherein the interface between the insulating structure and the patterned semiconductor structure is lower than an interface between the source/drain structure and the fin structure.

11. The semiconductor structure as claimed in claim 10, further comprising:

a sidewall layer covering a sidewall of the source/drain structure, a sidewall of the fin structure, and a sidewall of the patterned semiconductor structure.

12. The semiconductor structure as claimed in claim 8, wherein the gate structure and the patterned semiconductor structure are separated at least by the insulating structure.

13. The semiconductor structure as claimed in claim 8, wherein the insulating structure is in direct contact with the concave curved surface.

14. The semiconductor structure of claim 8, wherein the patterned semiconductor structure comprises a semiconductor material, wherein the insulating structure is an oxide of the semiconductor material.

15. The semiconductor structure of claim 8, wherein the insulating structure comprises:
    an oxide structure over the patterned semiconductor structure; and
    an isolation structure over the oxide structure, wherein the fin structure protrudes above an upper surface of the isolation structure.

16. A semiconductor structure, comprising:
    a substrate;
    a fin structure over the substrate;
    a patterned semiconductor structure adjacent to the fin structure over the substrate;
    an oxide structure over the patterned semiconductor structure, wherein the patterned semiconductor structure comprises a semiconductor material, wherein a material of the oxide structure comprises the semiconductor material and oxygen; and
    an isolation structure over the substrate, wherein a bottom surface of the isolation structure adjacent the fin structure opposite of the patterned semiconductor structure is level with a bottom surface of the isolation structure adjacent the patterned semiconductor structure opposite the fin structure and is level with a bottommost surface of the isolation structure between the fin structure and the patterned semiconductor structure in a cross-sectional view,
    wherein the isolation structure extends over the oxide structure,
    wherein the fin structure is taller than the patterned semiconductor structure, and the patterned semiconductor structure has a tip portion at an intersection between a curved segment and a sidewall segment in the cross-sectional view.

17. The semiconductor structure as claimed in claim 16, wherein a first end portion of the curved segment is higher than a middle portion of the curved segment.

18. The semiconductor structure as claimed in claim 17, wherein a second end portion of the curved segment is lower than the first end portion.

19. The semiconductor structure as claimed in claim 16, wherein a first sidewall of the patterned semiconductor structure is shorter than a second sidewall of the patterned semiconductor structure.

20. The semiconductor structure as claimed in claim 19, wherein the second sidewall of the patterned semiconductor structure is closer to the fin structure than the first sidewall of the patterned semiconductor structure is to the fin structure.

* * * * *